(12) United States Patent
Tsuzuki et al.

(10) Patent No.: US 6,476,691 B1
(45) Date of Patent: Nov. 5, 2002

(54) SURFACE ACOUSTIC WAVE FILTER

(75) Inventors: Shigeru Tsuzuki, Osaka (JP); Tsutomu Igaki, Hyogo (JP); Ken Matsunami, Kyoto (JP); Kazunori Nishimura, Kyoto (JP); Hiroyuki Nakamura, Osaka (JP); Toru Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/762,025
(22) PCT Filed: May 31, 2000
(86) PCT No.: PCT/JP00/03494
§ 371 (c)(1),
(2), (4) Date: Apr. 6, 2001
(87) PCT Pub. No.: WO00/76067
PCT Pub. Date: Dec. 14, 2000

(30) Foreign Application Priority Data

Jun. 3, 1999 (JP) ............................................. 11-156131

(51) Int. Cl.$^7$ ................................................. H03H 9/64
(52) U.S. Cl. ................................. 333/193; 310/313 R
(58) Field of Search ................................. 333/191, 187, 333/186, 188, 193, 194, 195, 196; 310/313 R, 313 B

(56) References Cited

U.S. PATENT DOCUMENTS

| 5,896,071 A | * | 4/1999 | Dai et al. ................ 310/313 B |
| 5,994,980 A | * | 11/1999 | Tada ....................... 310/313 R |
| 6,104,260 A | * | 8/2000 | Yamada et al. ............. 333/193 |
| 6,313,717 B1 | * | 11/2001 | Dufilie et al. ................ 333/193 |

* cited by examiner

Primary Examiner—Robert Pascal
Assistant Examiner—Dean Takaoka
(74) Attorney, Agent, or Firm—RatnerPrestia

(57) ABSTRACT

A SAW filter comprising a piezoelectric substrate and at least two filter tracks formed on the substrate, each having at least two IDT electrodes for input and output. The two filter tracks have substantially the same phase within a pass band, while it is substantially inverse-phased outside the pass band. For realizing the above-described conditions, input IDT electrode of one filter track is connected in parallel with input IDT electrode of the other filter track, while output IDT electrode of one filter track is connected in parallel with output IDT electrode of the other filter track. Furthermore, frequency values of said two filter tracks substantially coincide at a point 3 dB lower from the peak transfer function value. Thus the above-configured SAW filter of the present invention is smaller in the overall size and offers a broad pass band and a steep attenuation characteristic.

24 Claims, 30 Drawing Sheets

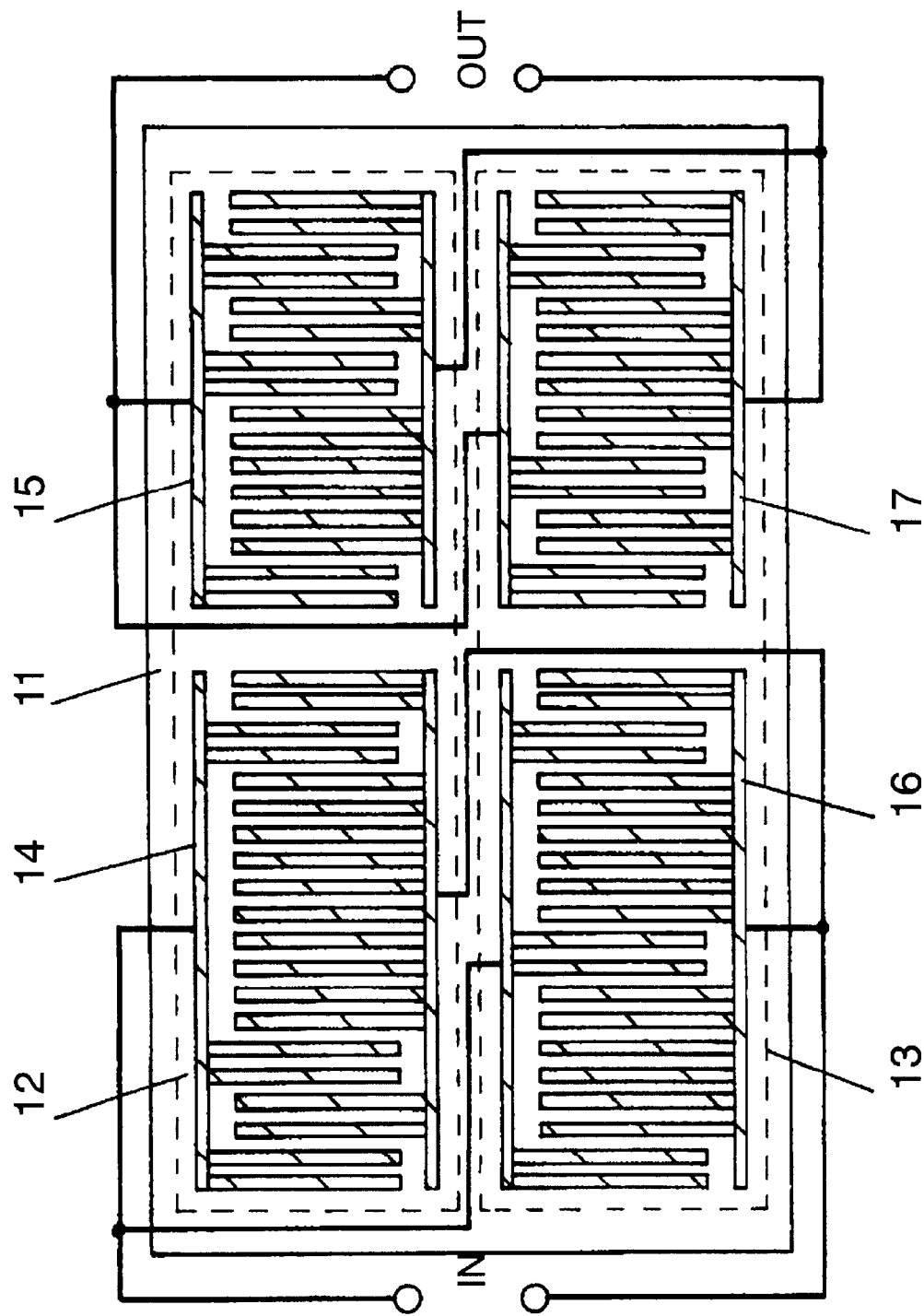

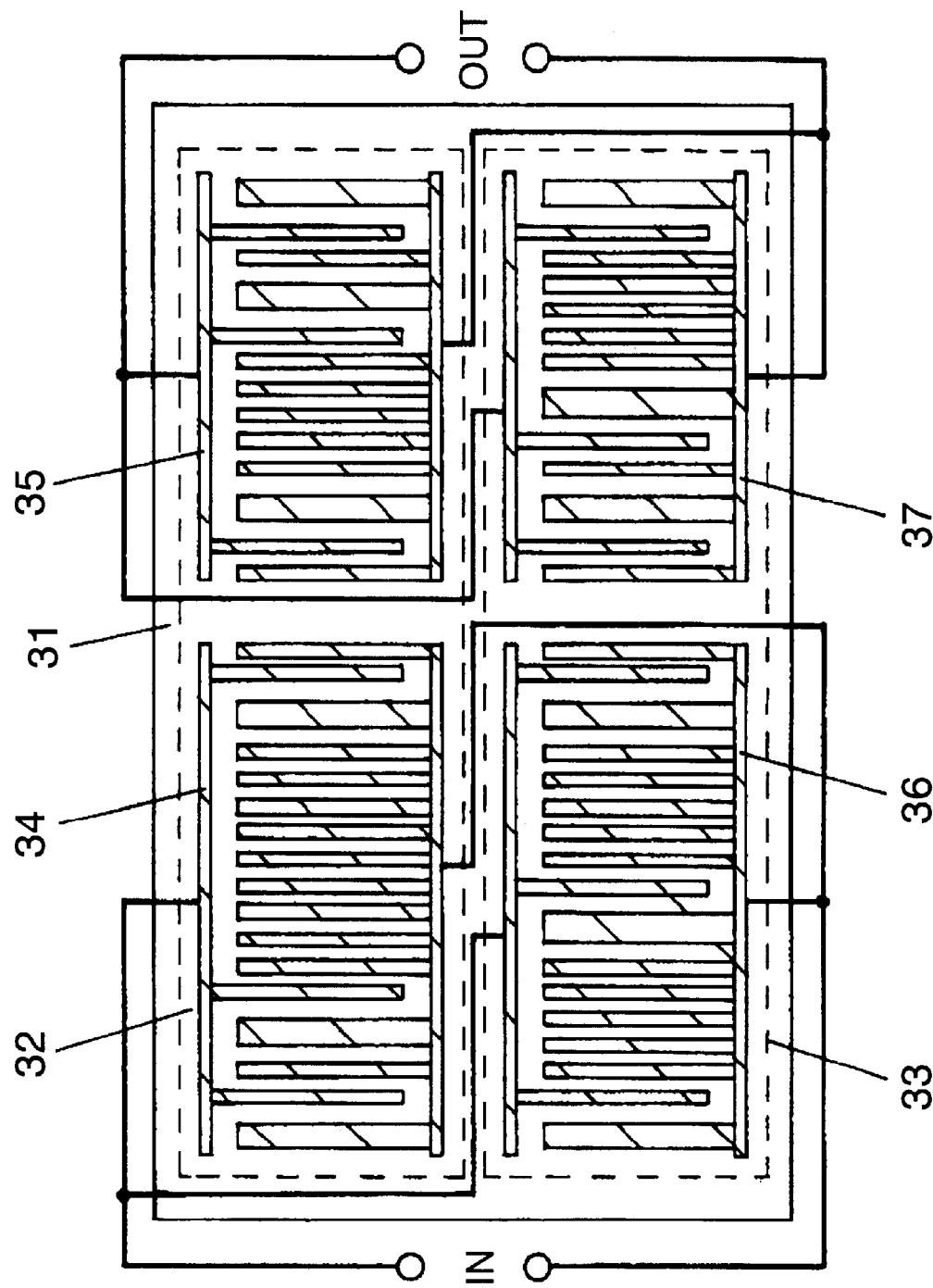

Insertion loss (fo) : 15.0dB
Band width (-5dB) : 1.30MHz

SURFACE ACOUSTIC WAVE FILTER

This application is a U.S. National Phase Application of PCT International Application PCT/JP00/03494.

TECHNICAL FIELD

The present invention relates to a surface acoustic wave filter for use in the high frequency (HF) circuit, the intermediate frequency (IF) circuit, etc. of wireless communication apparatus.

BACKGROUND ART

The transversal surface acoustic wave filter (SAW filter), with which the amplitude characteristic and the phase characteristic can be designed independently to each other, is suitable for use as, for example, an IF filter in CDMA mobile phone, which requires relatively broad pass band and the flatness of phase characteristic within the pass band is an important factor of the filter.

A conventional transversal SAW filter using unidirectional electrodes is described below.

FIG. 30 shows plan view of a conventional transversal SAW filter using unidirectional electrodes. Referring to FIG. 30, surface acoustic wave can be generated by providing inter digital transducer electrodes (IDT electrode) for input and output on a piezoelectric substrate 301. On the piezoelectric substrate 301, an input IDT electrode 302 and an output IDT electrode 303 are disposed with a certain specific distance between each other to form a transversal SAW filter.

In the above-configured SAW filter, the frequency characteristic is determined by means of weighting, which is conducted by thinning out electrode finger(s) of IDT electrodes 302, 303. In this way, the conventional technology implements the broad and flat filtering characteristic within pass band as well as a superior attenuation characteristic at the vicinity of the pass band region.

For use in today's compact and lightweight mobile terminals, the IF stage SAW filters are also requested to be smaller in size. In order to provide a transversal filter with a steep attenuation characteristic at the vicinity of pass band, the input and output IDT electrodes need to undergo sufficient weighting; which naturally leads to a longer length with the IDT electrodes. This blocks downsizing of the filter. Furthermore, if it is not possible to conduct the weighting on electrode without restriction, targeted characteristic may not be realized to a full satisfaction.

U.S. Pat. No. 6,011,344 discloses an electrode structure of SAW transducer, where two electrodes are provided on a piezoelectric substrate with a ½ wavelength shift, and electrodes of the two SAW transducers are connected in parallel. The proposed structure is intended to improving the high input/output impedance pertinent to the conventional DART type transducers. This, however, does not bring with it any contribution to reduce size of a SAW filter itself.

Japanese Laid-open Patent No. 2000-77974 discloses a SAW filter having a first and a second channels formed on a piezoelectric substrate (a 2-channel filter). In the 2-channel filter, the first channel and the second channel have the same phase characteristic within pass band, while it is inverse outside the pass band region. Although the band characteristic of the 2-channel SAW filter is steep and the size is compact, the characteristic within pass band is not flat.

The present invention aims to offer a compact SAW filter whose pass band is broad and flat within pass band, and the attenuation property is steep at the vicinity of the pass band.

DISCLOSURE OF THE INVENTION

SAW filter of the present invention comprises at least two filter tracks on a piezoelectric substrate, each of which filter tracks having at least two IDT electrodes for input and output. In the SAW filter, input IDT electrode of one filter track is connected in parallel with input IDT electrode of the other filter track, while output IDT electrode of one filter track is connected in parallel with output IDT electrode of the other filter track. Furthermore, frequency values of the respective filter tracks substantially coincide at a point 3 dB lower from the peak value of the transfer function. As to the phase relationship in the transfer function of the two filter tracks, it is substantially same-phased within a pass band, while it is substantially inverse outside the pass band. Thus a SAW filter of the present invention is smaller in size, broader in the pass band and steep in the attenuation characteristic outside the pass band.

BRIEF DESCRIPTION OF THE DRAWINGS

FIG. 1 Plan view of a SAW filter in a first exemplary embodiment of the present invention.

FIG. 3 Plan view of a SAW filter in a second exemplary embodiment of the present invention.

DESCRIPTION OF THE PREFERRED EMBODIMENTS

Figure 2A:
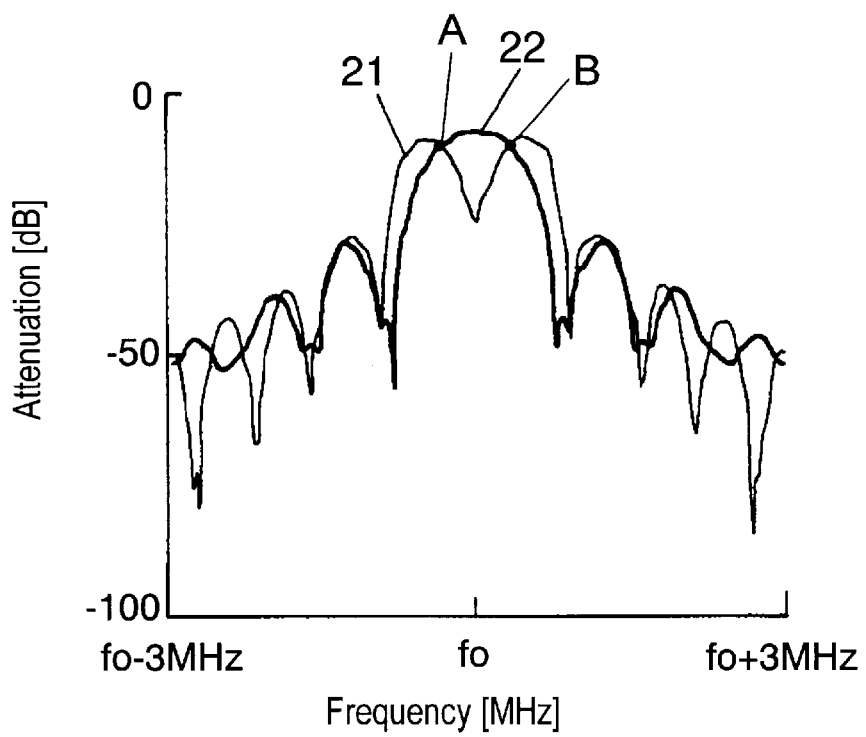
FIG. 2A Amplitude characteristic of each SAW filter track in FIG. 1.

Exemplary embodiments of the present invention are described in the following with reference to the drawings. For easier recognition of the structure of filter track, respective filter tracks are shown surrounded by dotted lines in the plan views of SAW filter.

First Embodiment

FIG. 1 shows plan view of a SAW filter in accordance with a first exemplary embodiment of the present invention. As shown in FIG. 1, a first filter track 12 and a second filter track 13 are formed in parallel on a piezoelectric substrate 11 made of a 28°–42° revolving Y cut crystal. The first filter track 12 comprises an input IDT electrode 14 and an output IDT electrode 15. Likewise, the second filter track 13 comprises an input IDT electrode 16 and an output IDT electrode 17.

The input IDT electrode 14 of first filter track 12 is connected in parallel with the input IDT electrode 16 of second filter track 13. Likewise, the output IDT electrode 15 of the first filter track 12 is connected in parallel with the output IDT electrode 17 of second filter track 13.

Operation of the above-configured SAW filter is described below.

Amplitude characteristic 21 of the first filter track 12 and amplitude characteristic 22 of the second filter track 13 of FIG. 1 are shown in FIG. 2A. Phase characteristic 23 of the first filter track 12 and phase characteristic 24 of the second filter track 13 of FIG. 1 are shown in FIG. 2B.

Figure 2B:
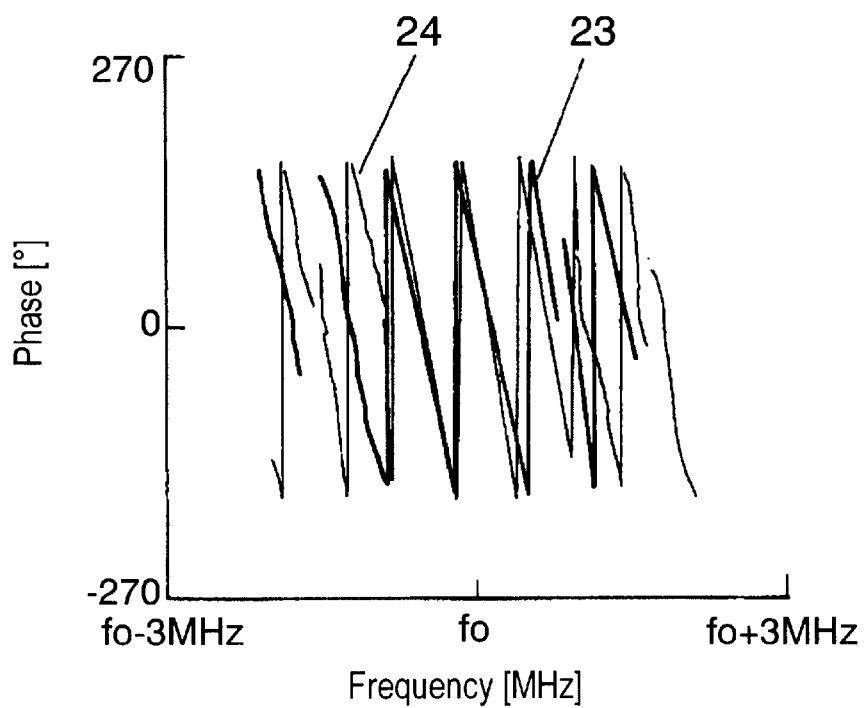
FIG. 2B Phase characteristic of each SAW filter track in FIG. 1.

As shown in FIG. 2B, difference in the phase between the first filter track 12 and the second filter track 13 is approximately 0°, or substantially same-phased, within pass band.

A situation substantially same-phased represents that the phase difference is within a range −50°–+50°, preferably, −20°–+20°.

As shown in FIG. 2A, the amplitude characteristic 21 of first filter track 12 has two peaks and broad pass band, but it at the same time provides a large insertion loss in the neighborhood of the center frequency. On the other hand, the amplitude characteristic 22 of second filter track 13 has its peak in the neighborhood of the center frequency and the insertion loss is small, but its pass band is narrow.

Since in the present embodiment the first filter track 12 and the second filter track 13 are substantially same-phased within the pass band, a flat and broad pass band can be obtained by connecting these filter tracks in parallel.

On the other hand, the first filter track 12 and the second filter track 13 show difference in the phase by approximately 180° outside the pass band region, viz. they are inverse-phased. The phase difference of approximately 180° represents a range 130°–230°, preferably 160°–200°.

As seen in FIG. 2A, level of the spurious outside the pass band is not quite suppressed in the amplitude characteristic 21 of first filter track and the amplitude characteristic 22 of second filter track 13, and there is no difference in the respective peak spurious frequency. In the present embodiment, however, phase of the first filter track 12 and the second filter track 13 is inverse to each other outside the pass band and the spurious level is almost identical; therefore, the spurious of first filter track 12 and that of second filter track 13 cancel to each other. As a result, a substantial amount of attenuation is obtained outside the pass band.

In order to provide flat and broad pass band region in the present invention, it is preferred that the respective amplitude characteristic 21 and 22 of the first filter track 12 and the second filter track 13 meet at a frequency value 3 dB lower than the peak transfer function value of the respective filter tracks, as indicated with point A and point B in FIG. 2A.

If attenuation is greater or smaller by more than 3 dB at the frequency where the attenuation said two filter tracks coincide, attenuation becomes too much in pass band at both ends, or it causes ripple leading to deteriorated flatness within the pass band.

Thus a SAW filter that offers flat and broad pass band and exhibits excellent attenuation outside the pass band can be implemented, by making the first filter track 12 and the second filter track 13 to take substantially the same phase within pass band while it is inverse outside the pass band, and making the frequencies at which respective filter tracks assume a value 3 dB lower than the peak transfer function value substantially coincide.

In SAW filters structured in accordance with the present embodiment, length of the input/output IDT electrodes can be made shorter as compared with those of identical filter characteristics manufactured through conventional technology. Therefore, the size of a SAW filter in the present invention is significantly smaller than that of conventional technology. Furthermore, a SAW filter in the present embodiment has flat and broad pass band and steep attenuation characteristic outside the pass band.

Second Embodiment

FIG. 3 shows plan view of a SAW filter in accordance with a second exemplary embodiment. In the same manner as in embodiment 1, a first filter track 32 and a second filter track 33, having input/output IDT electrodes 34, 35 and 36, 37, respectively, are formed on a piezoelectric substrate 31. The amplitude and the phase characteristics in the first and the second filter tracks 32, 33 remain the same as in embodiment 1.

Point of difference from embodiment 1 is that the EWC-SPUDT (Electrode Width Controlled Single Phase Unidirectional Transducer), or a so-called unidirectional electrode, is used for the IDT electrodes 34, 35, 36, 37. Namely, when each of the IDT electrodes 34, 35, 36, 37 are split into areas corresponding to wavelength of surface acoustic wave $\lambda$, one electrode finger of $\lambda/4$ width and two electrode fingers of $\lambda/8$ width, totaling three electrode fingers are in each area. In FIG. 3, the IDT electrodes 34, 36 are rightward directional, while the output IDT electrodes 35, 37 are leftward directional. The first and the second filter tracks 32, 33 are connected in the same way as in embodiment 1 through their respective electrodes, and relative relationship among the first and the second filter tracks is substantially same-phased within pass band, while it is substantially inverse-phased outside the pass band.

SAW filters of the above-described configuration are provided with flat and broad pass bandwidth and significant attenuation outside the pass band. Insertion loss can be reduced as well. The effect stems from a structure that center for exciting the surface acoustic wave and center of reflection are in an asymmetrical relationship in the first and the second filter tracks 32, 33, and the bi-directional loss is reduced.

When unidirectional electrodes are used for the IDT electrodes 34, 35, 36, 37, the insertion loss can be reduced and the ripple within pass band can be suppressed effectively by establishing the metallization ratio (total sum of width of the electrodes fingers existing within $\lambda$ area/$\lambda$) to be 0.45–0.65, preferably 0.5–0.6. The metallization ratio smaller than 0.45 results in a reduced line width of electrode fingers, which invites an increased resistance loss. On the other hand, the ratio greater than 0.65 results in reduced space between the electrode fingers, which causes a difficulty in forming the fingers.

Furthermore, when metal containing aluminum as the main component is used for the input/output IDT electrodes, the insertion loss can be reduced and the ripple within pass band may be made smaller by establishing the film thickness ratio ($h/\lambda$) between the electrode film thickness h and the wavelength of surface acoustic wave $\lambda$ to be 0.005–0.035.

Third Embodiment

Figure 4:
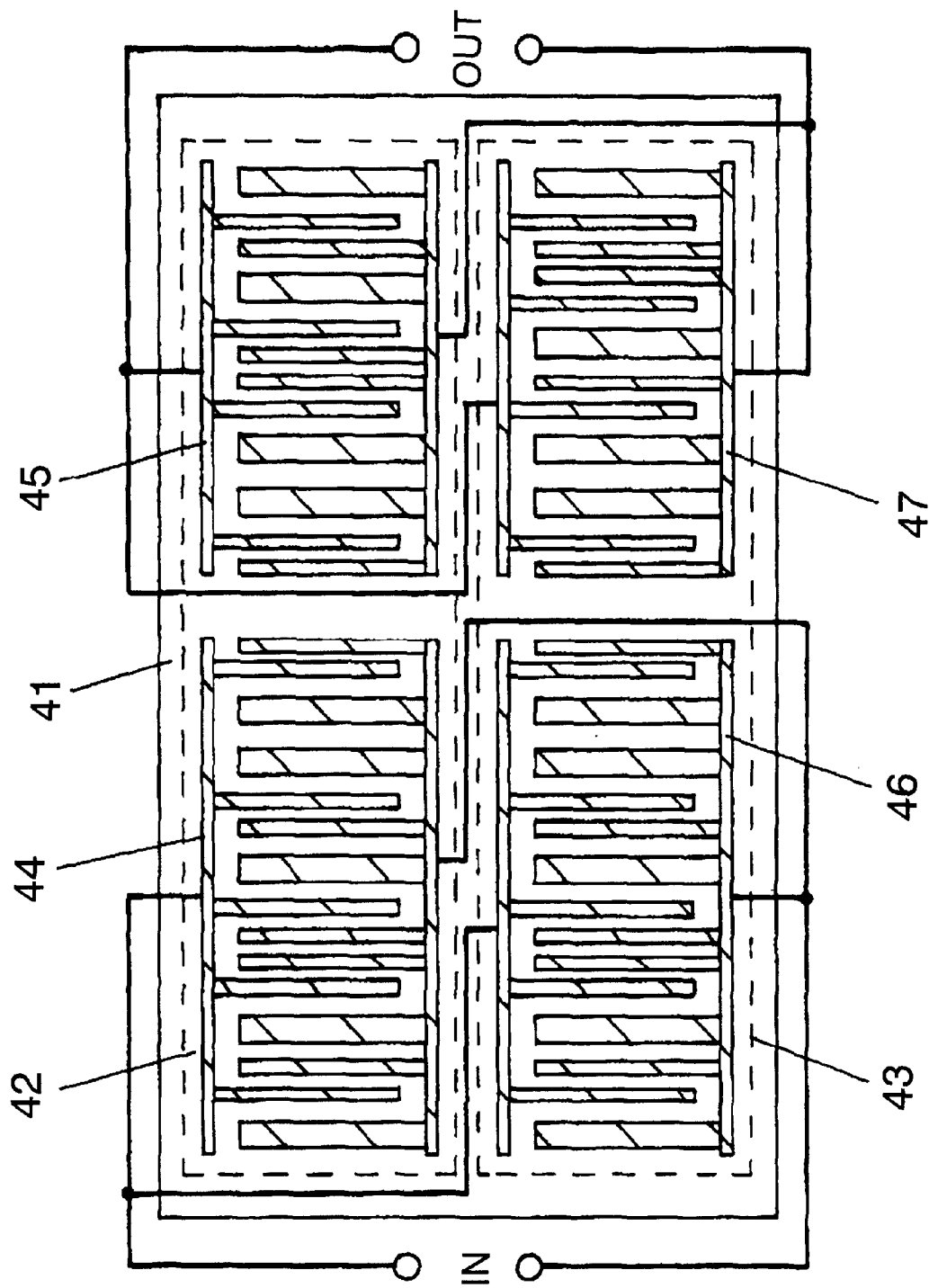
FIG. 4 Plan view of a SAW filter in a third exemplary embodiment of the present invention.

FIG. 4 shows plan view of a SAW filter in a third exemplary embodiment of the present invention.

In the present embodiment 3, input/output IDT electrodes 44, 45, 46, 47 of a first filter track 42 and a second filter track 43 have a structure called R-SPUDT (Resonant SPUDT). Like in embodiment 2, when each of the IDT electrodes 44, 45, 46, 47 are split into areas corresponding to wavelength $\lambda$ of surface acoustic wave, one electrode finger of $\lambda/4$ width and two electrode fingers of $\lambda/8$ width, totaling three electrode fingers are in each area. The amplitude characteristic and the phase characteristic with the first and the second filter tracks 42, 43 remain the same as in embodiment 1.

Figure 5:
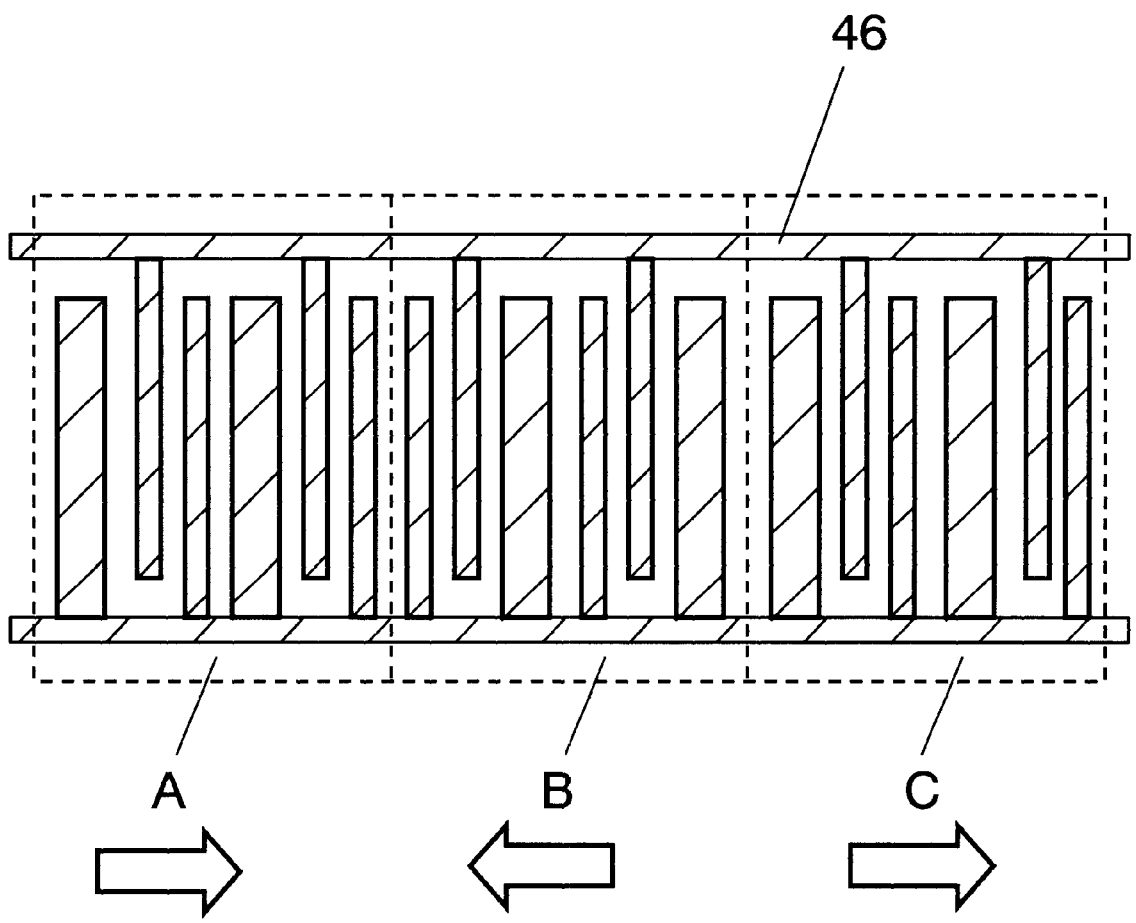
FIG. 5 Plan view of an IDT electrode, magnified in part, of the SAW filter of FIG. 4.

Referring to FIG. 5, the arrow marks indicate directional property of respective areas A, B and C surrounded by dotted lines. The areas A and C are provided with unidirectional property towards the right in the drawing, while the area B is provided with an opposite unidirectional property towards the left. The input IDT electrode 46 as a whole is unidirectional towards the right in the drawing.

Other IDT electrodes 44, 45, 47 are also unidirectional under the same structure. In each of the filter tracks 42, 43, the directional property of IDT electrode 44 opposes to that of the IDT electrode 45, and the directional property of IDT electrode 46 to that of the IDT electrode 47.

In embodiment 2, each of the areas in an IDT electrode is provided with the same directional property. While in the R-SPUDT, an area is provided with a directional property that is opposite in relation to other areas, thus a resonance cavity is formed within an IDT electrode.

As a result, the length of IDT electrode can be made still shorter than that in embodiment 2, and a SAW filter can be downsized furthermore.

Figure 7:
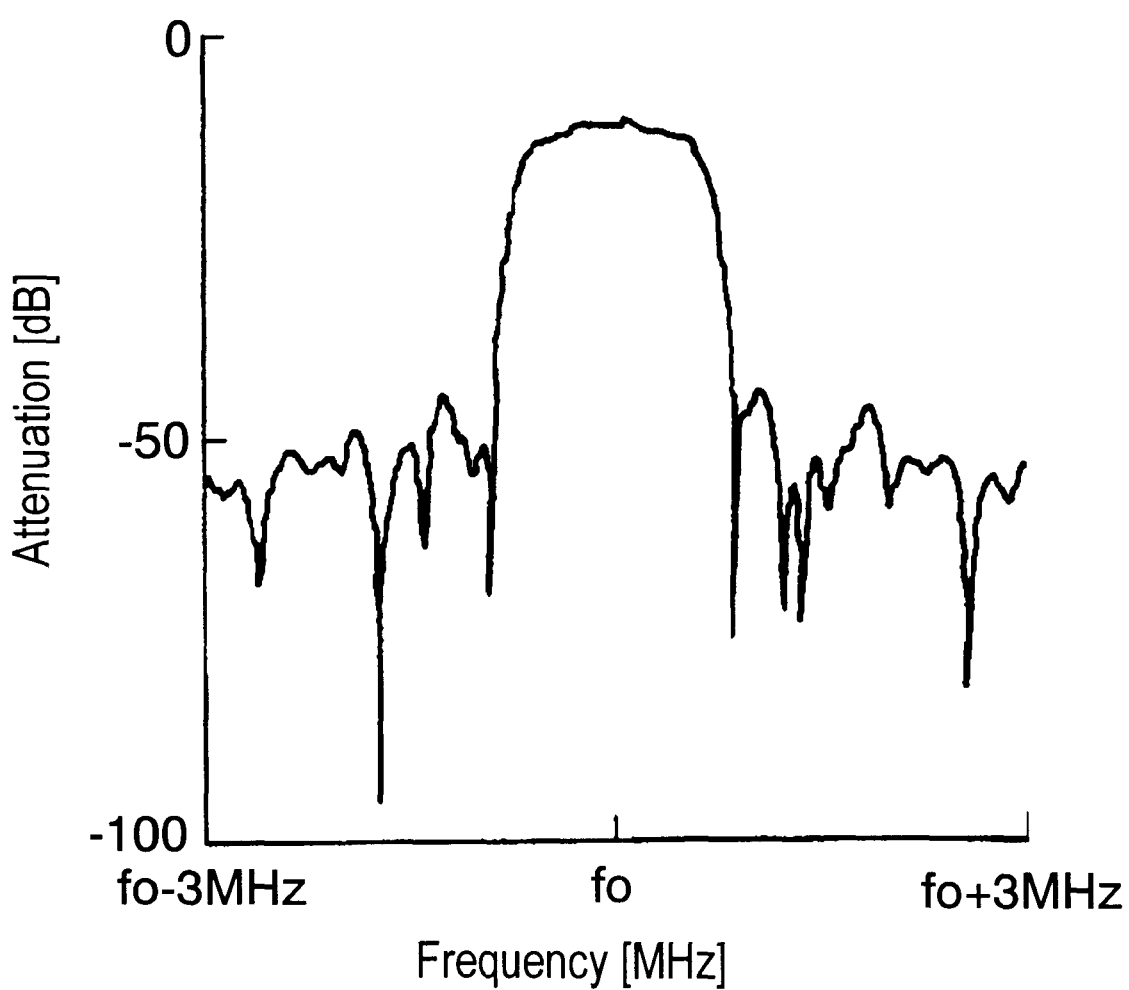
FIG. 7 Characteristic of the SAW filter of FIG. 4.
Figure 8:
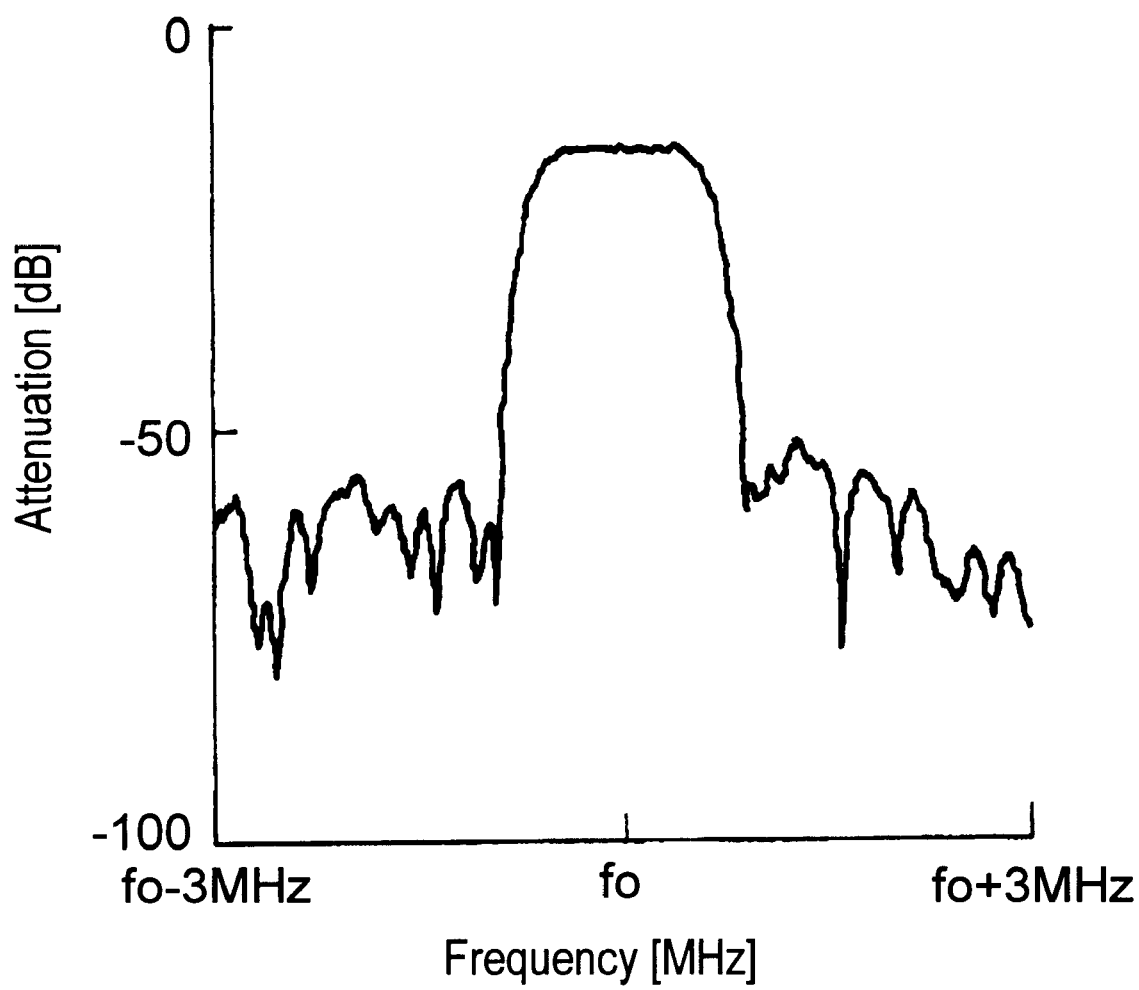
FIG. 8 Characteristic of a conventional SAW filter.

FIG. 7 shows characteristics of the SAW filter of FIG. 4. Also characteristics of a conventional SAW filter are shown in FIG. 8, for the sake of comparison. Through a comparison, it is known that the SAW filter in the present embodiment provides broad and flat pass band and an excellent attenuation characteristic in the vicinity of the pass band, despite its size reduced by approximately 30% in terms of area as compared with the conventional ones. The insertion loss can also be reduced. Results of measurement show that the insertion loss is 11.0 dB with the present embodiment, while it is 15 0 dB with the conventional one; or, a 4 dB reduction in the insertion loss. The –5 dB bandwidth is 1.35 MHz in the present embodiment, which compares to 1.30 MHz of the conventional one.

Fourth Embodiment

Figure 6:
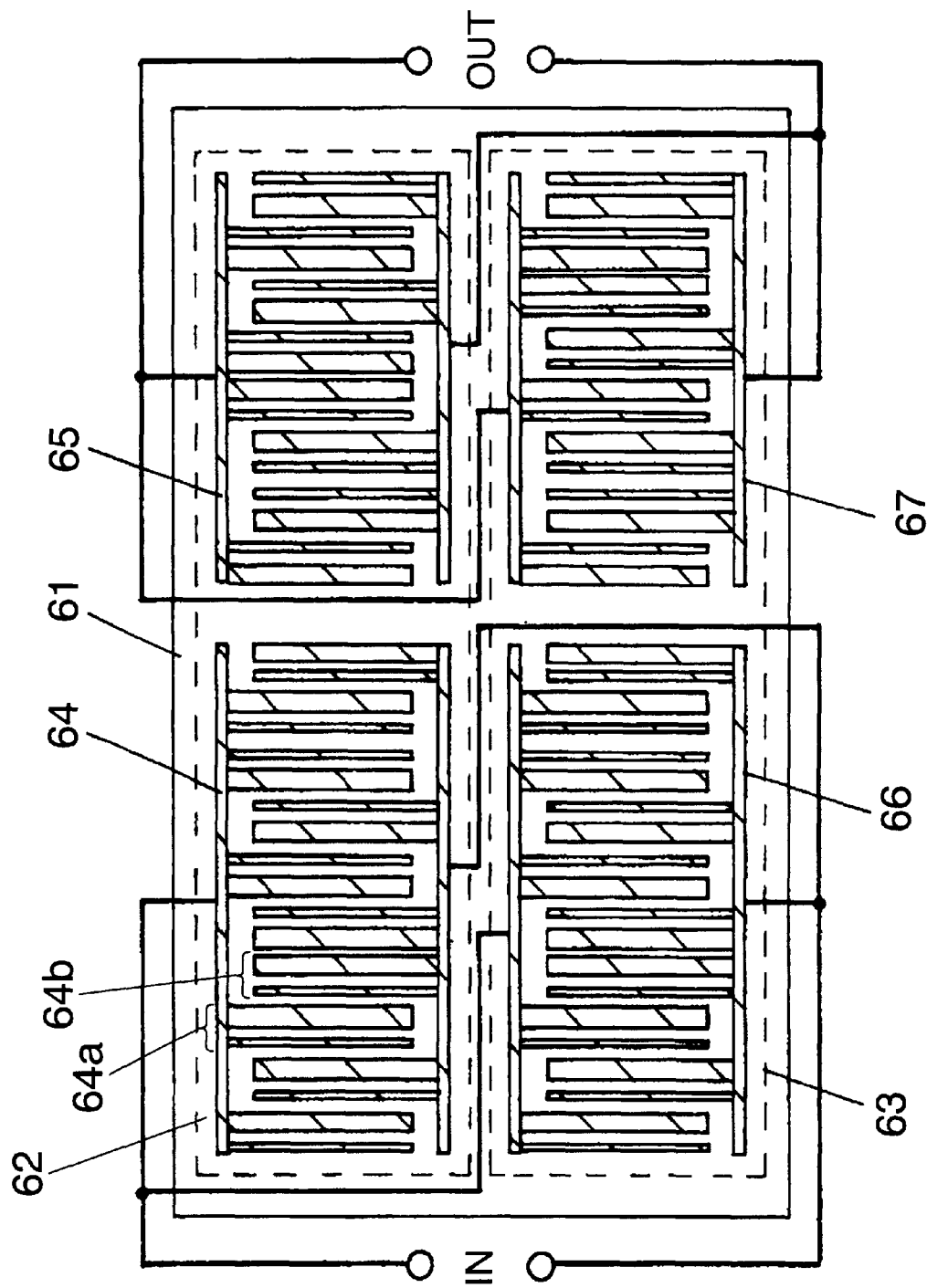
FIG. 6 Plan view of a SAW filter in a fourth exemplary embodiment of the present invention.

FIG. 6 shows plan view of a SAW filter in a fourth exemplary embodiment. Point of difference as compared with that of embodiment 3 is that, in the present embodiment, the number of electrode finger counts are 43 for each of the one-wavelength areas in the respective input/output IDT electrodes 64, 65, 66, 67 of first and second filter tracks 62, 63 having a directional property. Another point of difference is that an electrode finger couple is formed of two electrode fingers having different width, and the electrode finger couples are disposed to oppose each other (for example, 64a and 64b in FIG. 6). In contrast, the number of electrode fingers within an area of one-wavelength of surface acoustic wave travelling on piezoelectric substrate 61 was 3 in embodiment 2.

Defining the line width of finer electrode finger as L1, that of the broader electrode finger as L2, and the ratio between them as line width ratio (L2/L1), the L2/L1 should take a value 1 or greater, preferably within a range 1.4–3.6. By so doing, the SAW filter insertion loss may be made the smallest. Through optimization of L2/L1, the directional property of surface acoustic wave can be controlled, and the ripple within pass band due to an insufficient, or an excessive, orientation of directional property can be suppressed. Thus the SAW filters having flat pass band characteristic are offered.

The great L2/L1 value represents a smaller line width L1 of the finer electrode finger. If L1 is made too small, it turns out difficult to form an electrode finger at high precision, and the resistance loss at the electrode finger will increase. Therefore, the greatest practical L2/L1 value should preferably be around 3.6.

Since the optimum L2/L1 value depends on number of the electrode fingers and the film thickness of electrode finger, the insertion loss can be made smaller by shifting the L2/L1 value, in a case where the input/output IDT electrodes of different structures are used.

Use of the input/output IDT electrodes of the present embodiment increases the efficiency of exciting surface acoustic waves. Or, impedance of the input/output IDT electrodes can be lowered. These integrally lead to a SAW filter of low insertion loss.

Figure 9:
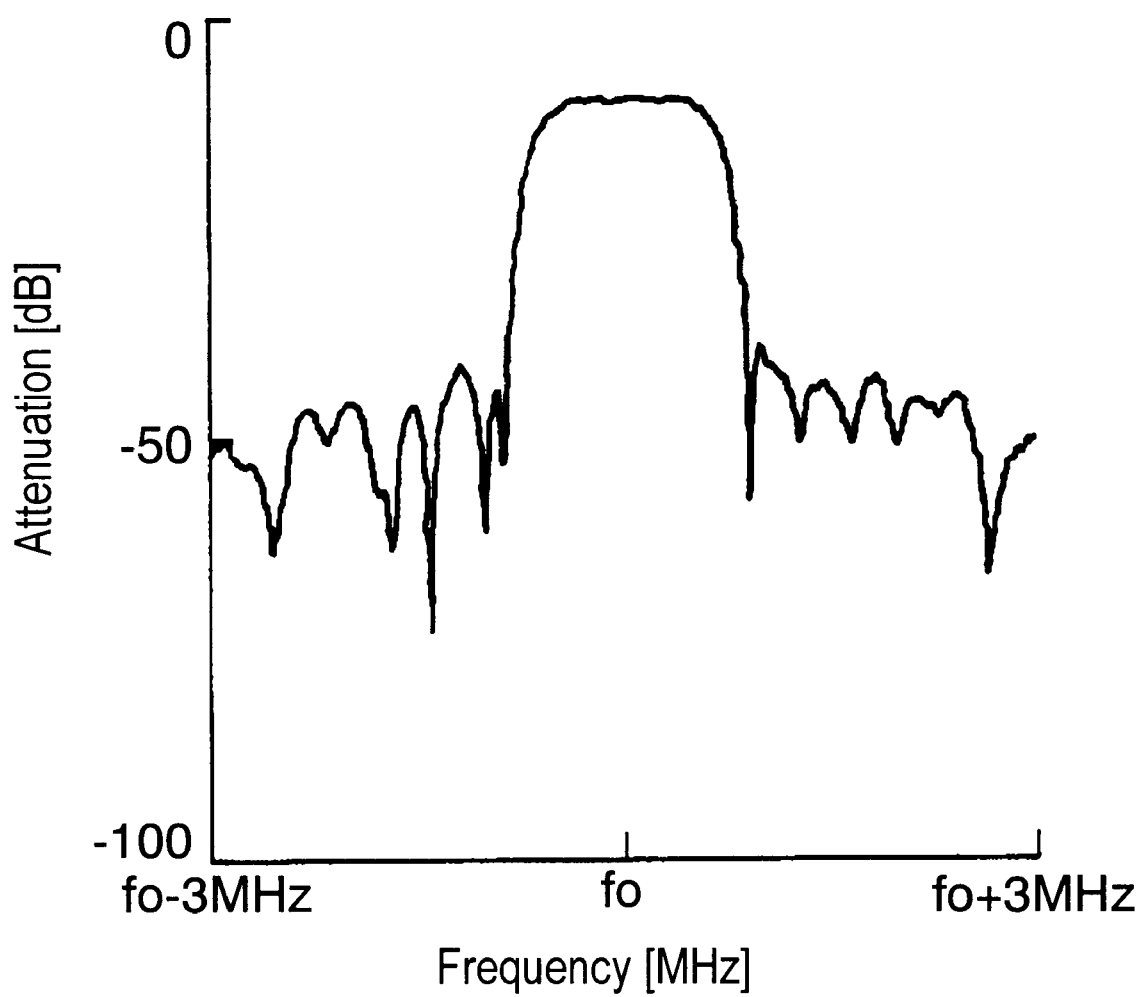
FIG. 9 Characteristic of the SAW filter of FIG. 6.

SAW filter characteristics in the present embodiment are as shown in FIG. 9. As compared with the counterpart shown in FIG. 7, the insertion loss (9.5 dB) at center frequency ($f_0$) is lower by approximately 1.5 dB (ref. the loss of 11.0 dB in FIG. 7). Thus it proves to be effective for lowering the insertion loss. The –5 dB bandwidth is 1.35 MHz in either one of the filters.

Fifth Embodiment

Figure 13:
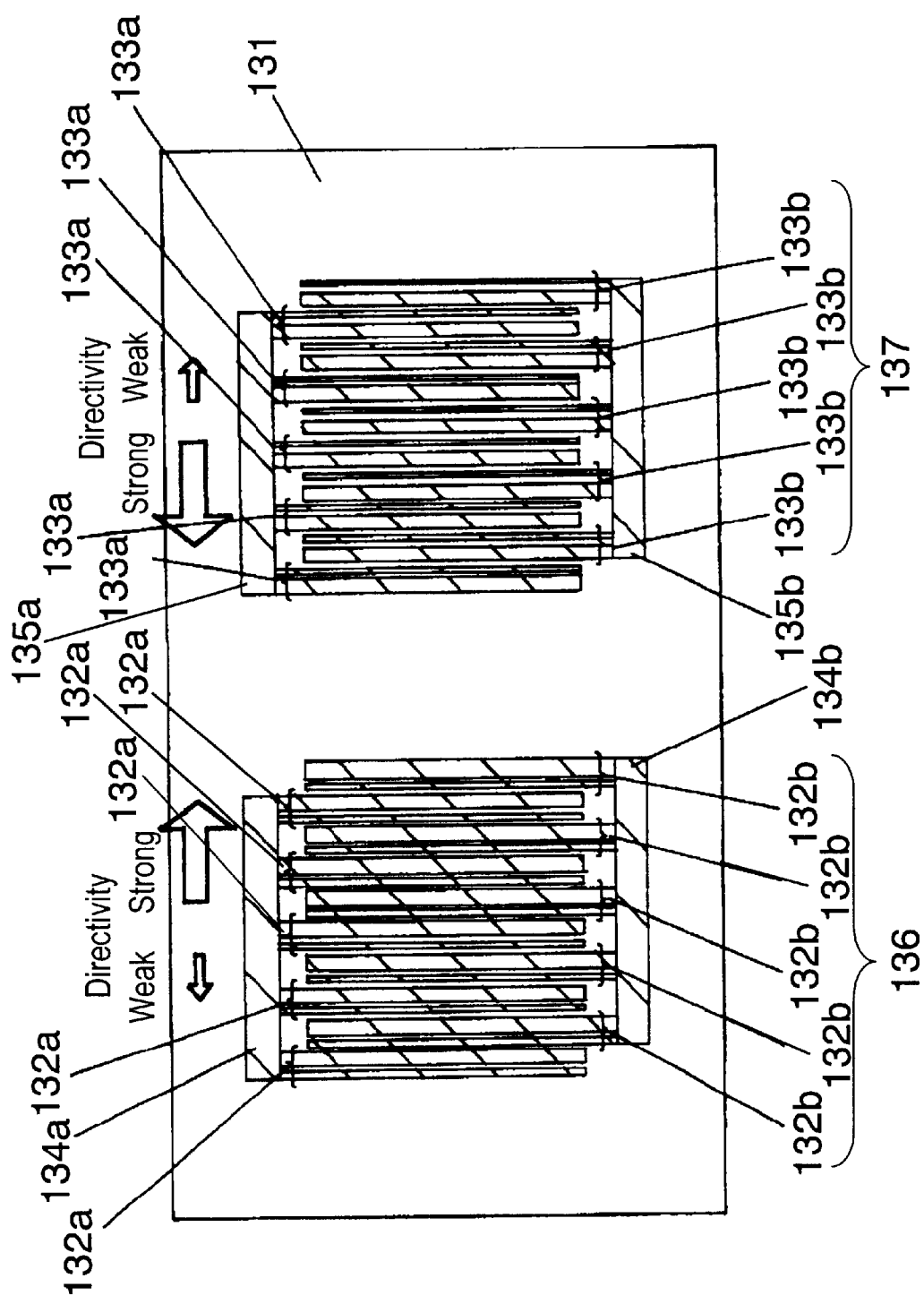
FIG. 13 Plan view of a SAW filter in a fifth exemplary embodiment of the present invention.
Figure 14:
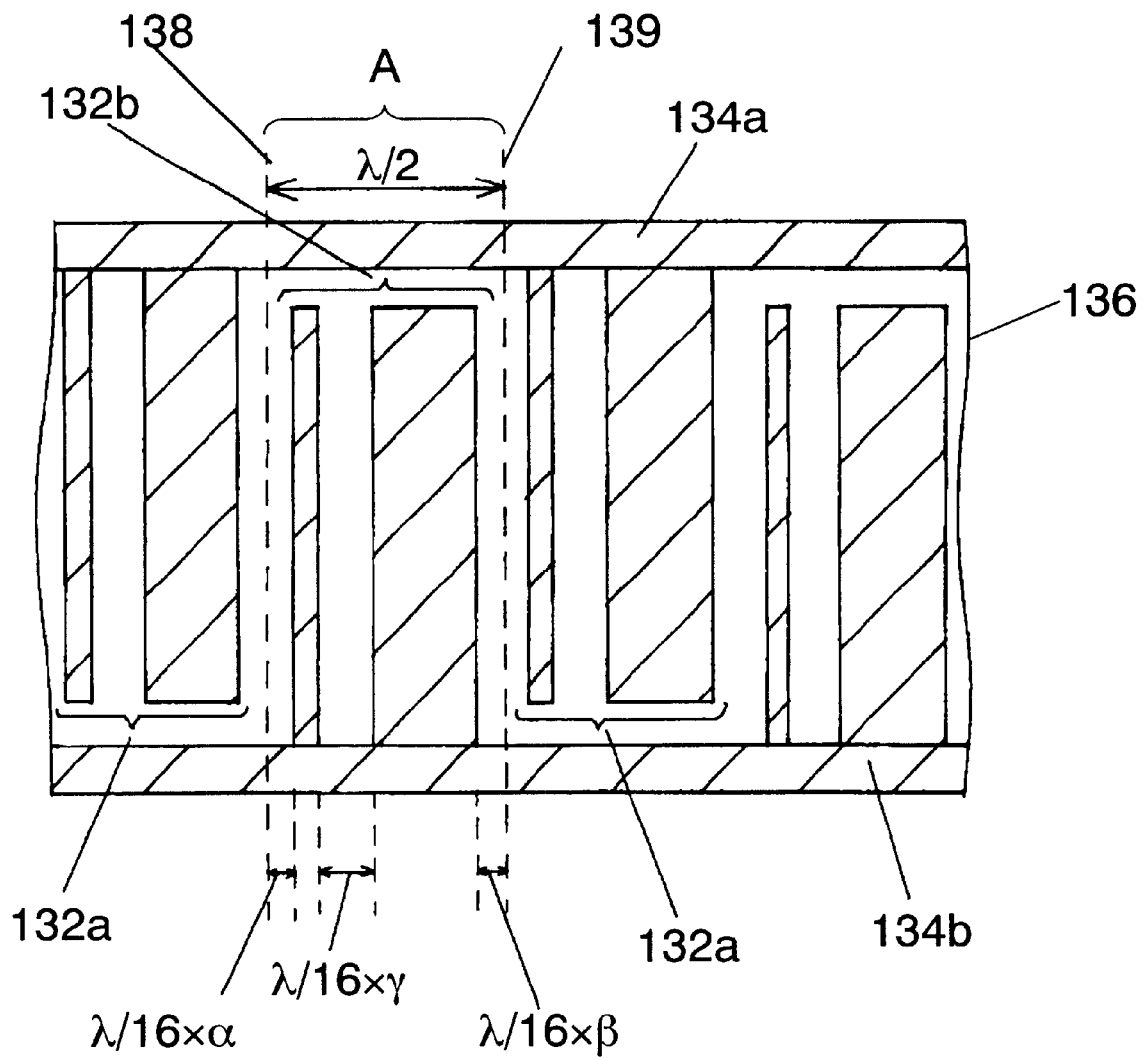
FIG. 14 Magnified view of a key portion of FIG. 13.

FIG. 13 is a plan view of filter track in a fifth exemplary embodiment. This corresponds to one of the filter tracks in embodiments 1–4. FIG. 14 is magnified view of a key portion of FIG. 13.

As shown in FIG. 13, an input IDT electrode 136 and an output IDT electrode 137 are formed on a piezoelectric substrate 131. The respective input/output IDT electrodes 136, 137 are provided with electrode finger couples 132a, 132b and 133a, 133b, opposing to each other, and lead electrodes 134a, 134b and 135a, 135b connecting these. As shown magnified in FIG. 14, each of the electrode finger couples 132a, 132b, 133a, 133b is formed on two electrode fingers of different line width. Each of the respective electrode finger couples is positioned in an area of 1/2 $\lambda$.

The electrodes 136, 137 are formed using aluminum or an aluminum alloy. The line width ratio of the electrodes 136, 137 should be not smaller than 1.0, preferably 1.4–3.6.

In FIG. 14, the dotted lines are border lines 138, 139 splitting the electrode 136 at $\lambda/2$. An area between the border lines 138 and 139 is referred to as area A.

In the area A, a distance value between the finer electrode finger and the broader electrode finger of electrode finger couple 132b normalized with $\lambda/16$ is defined as $\gamma$, a distance value between the finer electrode finger of electrode finger couple 132b and the border line 138 normalized with $\lambda/16$ as $\alpha$, and a distance value between the broader electrode finger of electrode finger couple 132b and the border line 139 normalized with $\lambda/16$ as $\beta$; the configuration is arranged to satisfy $$\gamma > \alpha + \beta.$$

Other electrode finger couple 132a of electrode 136, and electrode finger couples 133a, 133b of electrode 137 have also been structured in the like manner. The directional properties of electrode 136 and electrode 137 are opposed to each other.

Figure 15A:
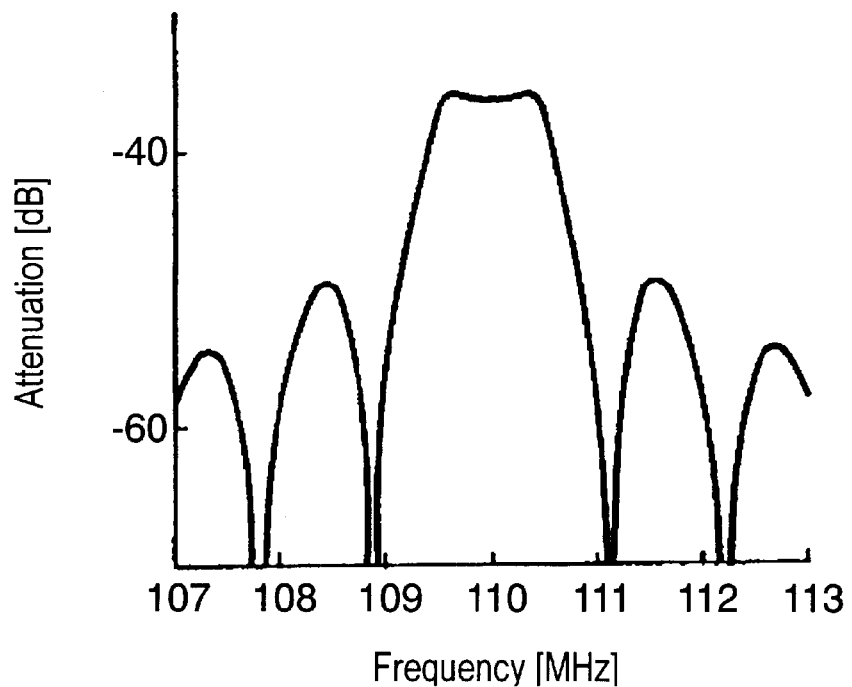
FIG. 15A Characteristic showing the electro-mechanical conversion in the direction of stronger propagation in the SAW filter of embodiment 5.
Figure 15B:
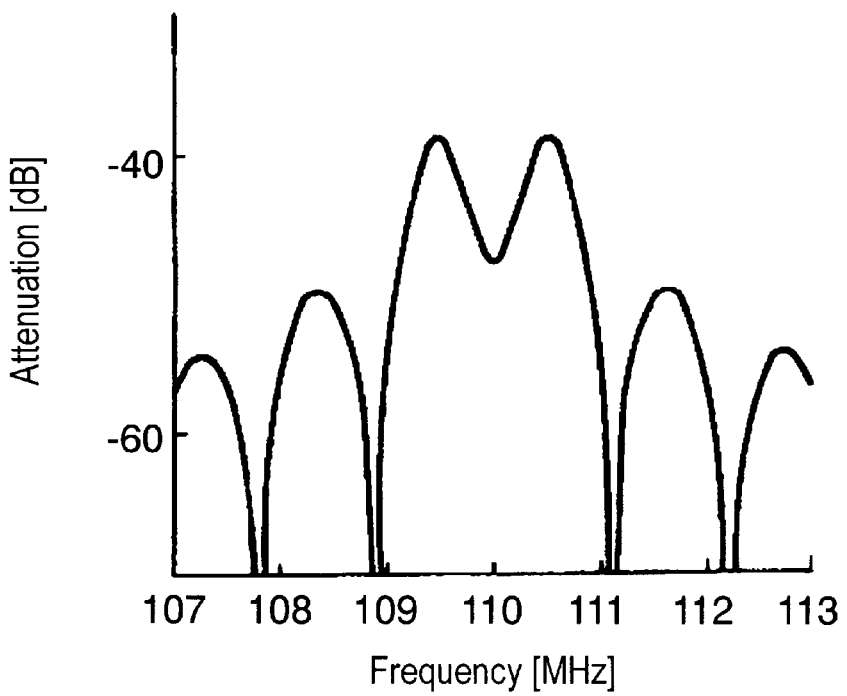
FIG. 15B Characteristic showing the electro-mechanical conversion in the direction of weaker propagation in the SAW filter of embodiment 5.

With the filter track, the electro-mechanical conversion characteristic with respect to the stronger directional property is shown in FIG. 15A, while that with the weaker directional property in FIG. 15B. Each of the electrodes 136 and 137 has 100 pairs of electrode finger couple formed of electrode fingers of different line width, the film thickness ratio is 0.015, the line width ratio is 3, $\alpha=\beta=0.41$, $\gamma=2$.

Figure 16A:
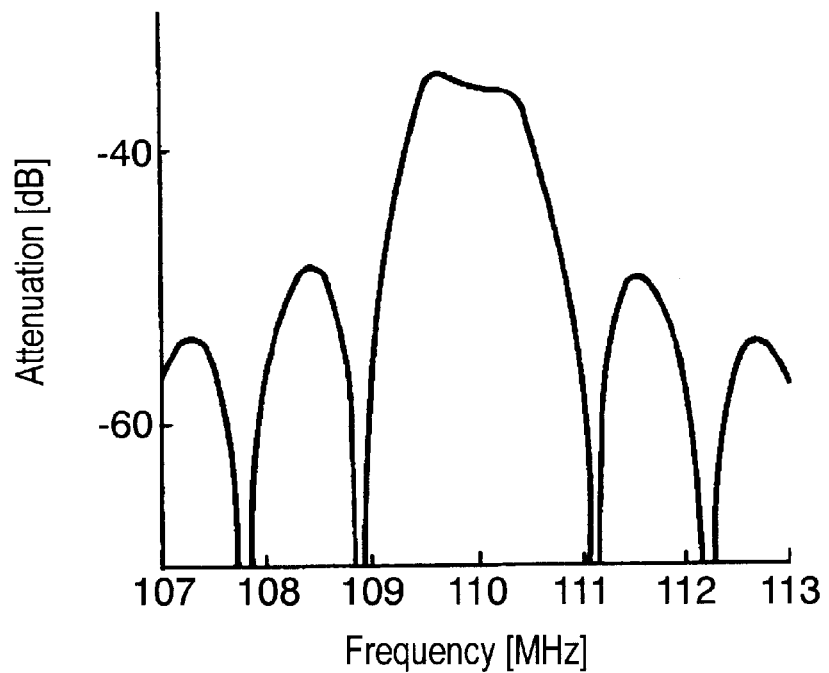
FIG. 16A Characteristic showing the electro-mechanical conversion in the direction of stronger propagation in a comparative example of the SAW filter.
Figure 16B:
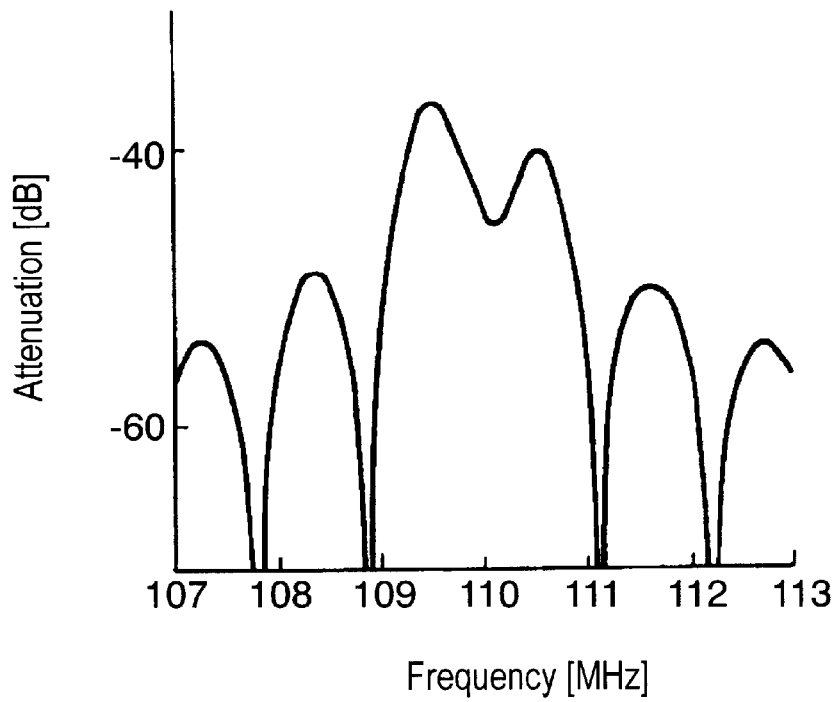
FIG. 16B Characteristic showing the electro-mechanical conversion in the direction of weaker propagation in a comparative example of the SAW filter.

For the sake of comparison, other filter track having the same structure except that $\alpha=\beta=1$, $\gamma=2$ was prepared. The electro-mechanical conversion characteristic with respect to the stronger directional property of thus prepared filter track is shown in FIG. 16A, and that with the weaker directional property in FIG. 16B.

When FIG. 15 are compared with FIG. 16, it becomes known that the structure in the present embodiment is superior with respect to the symmetry. Therefore, the ripple in the pass band can be made still smaller, and the attenuation outside the pass band still greater.

Accordingly, by forming the filter tracks having the structure of FIG. 13 on a piezoelectric substrate and connecting them in parallel as described in embodiments 1 through 4 so that their relative relationship is substantially same-phased within pass band and substantially inverse-phased outside the pass band, a SAW filter can reduce the ripple in the pass band and increase the attenuation outside the pass band. The amplitude characteristics of the two filter tracks are made to be the same as in embodiment 1.

Figure 17:
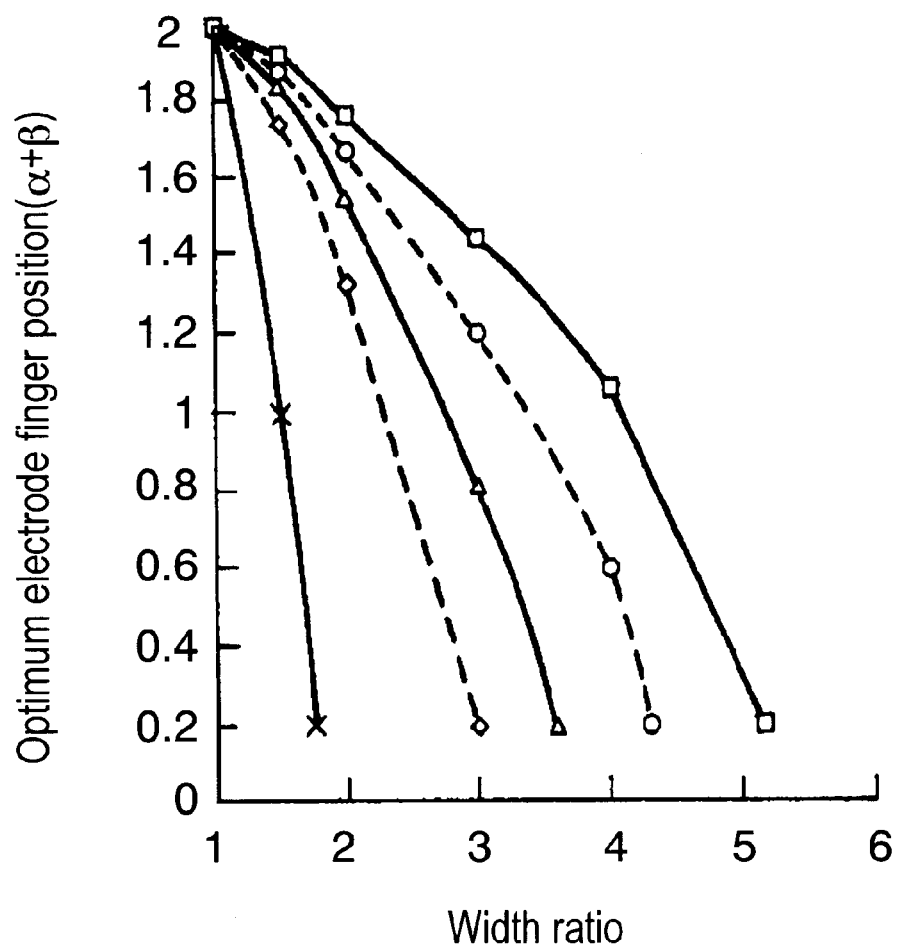
FIG. 17 Relationship between the ratio of line width and the α+β in exemplary embodiments.

FIG. 17 shows optimum values of $\alpha+\beta$ at $\gamma=2$, in the examples of film thickness ratio 0.005, 0.010, 0.015, 0.020 and 0.30; where, a 28°–42° revolving Y cut crystal is used for the piezoelectric substrate 131, center frequency is 110 MHz, number of the electrode finger couples are 100. It is known from FIG. 17 that when the line width ratio is greater than 1, optimum value of the $\alpha+\beta$ is always smaller than the $\gamma$.

Sixth Embodiment

Figure 18:
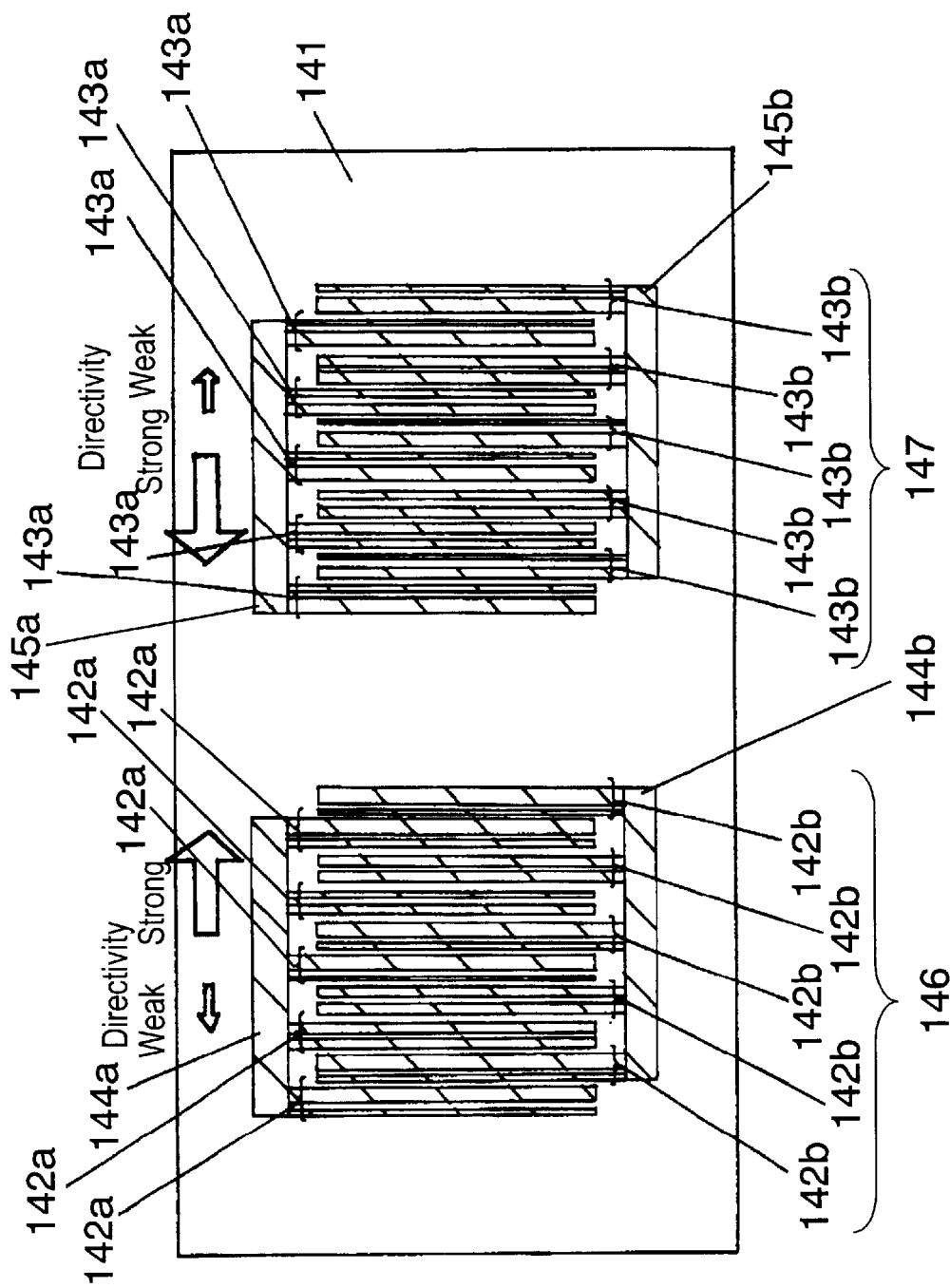
FIG. 18 Plan view of a SAW filter in a sixth exemplary embodiment of the present invention.
Figure 19:
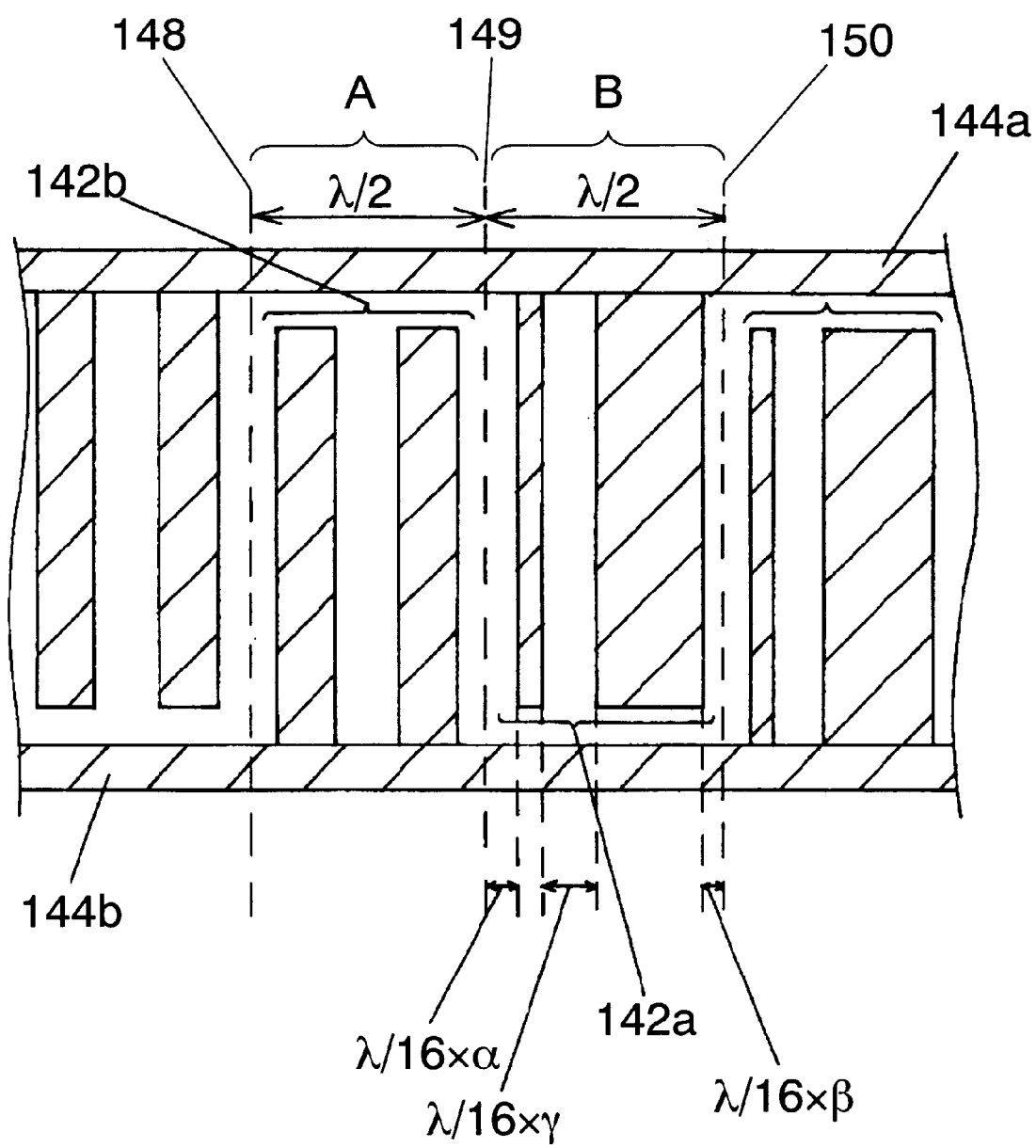
FIG. 19 Magnified view of a key portion of FIG. 18.

FIG. 18 is plan view of a filter track in a sixth exemplary embodiment. FIG. 19 is magnified view in a key part of FIG. 18. SAW filter of the present embodiment comprises an input IDT electrode 146, an output IDT electrode 147, electrode finger couples 142a, 142b and 143a, 143b, and lead electrodes 144a, 144b and 145a, 145b for connecting these, formed on a piezoelectric substrate 141. Line width ratio of the IDT electrode 146, 147 should be not smaller than 1.0, preferably 1.4–3.6.

Among the electrode finger couples 142a, 142b, 143a, 143b, some of the finger couples consist of two electrode fingers of different line width, while other finger couples consist of two electrode fingers of the same line width. Each of the respective electrode finger couples 142a, 142b, 143a, 143b is positioned in an area of 1/2 $\lambda$. The IDT electrodes 146, 147 are formed by using aluminum or an aluminum alloy.

Relationship in the line width among the electrode finger couples 142a, 142b, 143a, 143b in an above-configured SAW filter is shown in detail in FIG. 19.

In FIG. 19, the dotted lines represent border lines 148, 149, 150 splitting the electrode 146 by a unit $\lambda/2$. The area between the border lines 148 and 149 is referred to as area A, and the area between the border lines 149 and 150 as area B. The respective electrode finger couples 142a and 142b are formed to be existing in the areas B and A.

In the area B, a distance value between the finer electrode finger and the broader electrode finger of electrode finger couple 142a normalized with $\lambda/16$ is defined as $\gamma$, a distance value between the finer electrode finger of electrode finger couple 142a and the border line 149 normalized with $\lambda/16$ as $\alpha$, and a distance value between the broader electrode finger of electrode finger couple 142a and the border line 150 normalized with $\lambda/16$ as $\beta$; the configuration is arranged to satisfy $$\gamma > \alpha + \beta \text{ and } \alpha < \beta.$$

Other electrode finger couples 142a of the IDT electrode 146 assume the like structure, and the IDT electrode 147 is structured the same as the IDT electrode 146. And the IDT electrode 146 and the IDT electrode 147 are opposing to each other in the directional property.

Figure 20A:
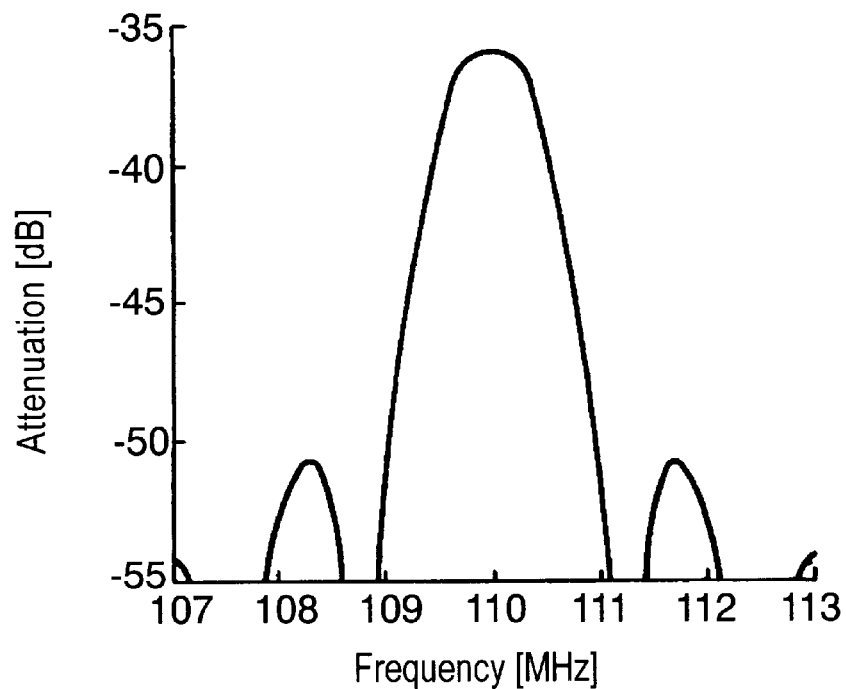
FIG. 20A Characteristic showing the electro-mechanical conversion in the direction of stronger propagation in a SAW filter of embodiment 6.
Figure 20B:
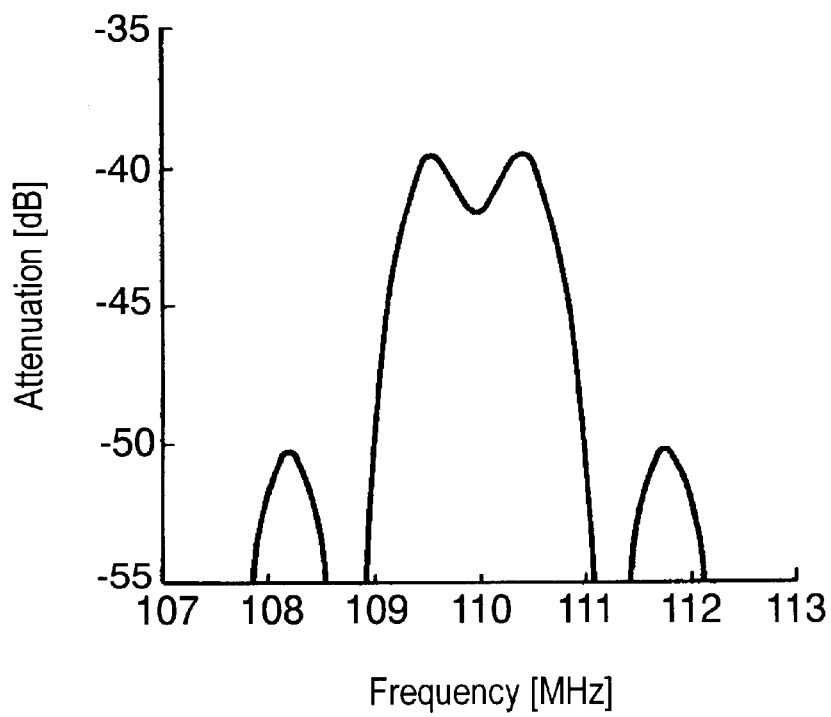
FIG. 20B Characteristic showing the electro-mechanical conversion in the direction of weaker propagation in the SAW filter of embodiment 6.

With the filter track, the electro-mechanical conversion characteristic with respect to the stronger directional property is shown in FIG. 20A, while that with the weaker directional property in FIG. 20B. Each of the electrodes 146 and 147 has 50 pairs of electrode finger couple formed of electrode fingers of different line width and 40 pairs of electrode finger couple formed of electrode fingers of the same line width, the film thickness ratio is 0.015, the line width ratio is 3, $\alpha=0.15$, $\beta=0.67$, $\gamma=2$.

Figure 21A:
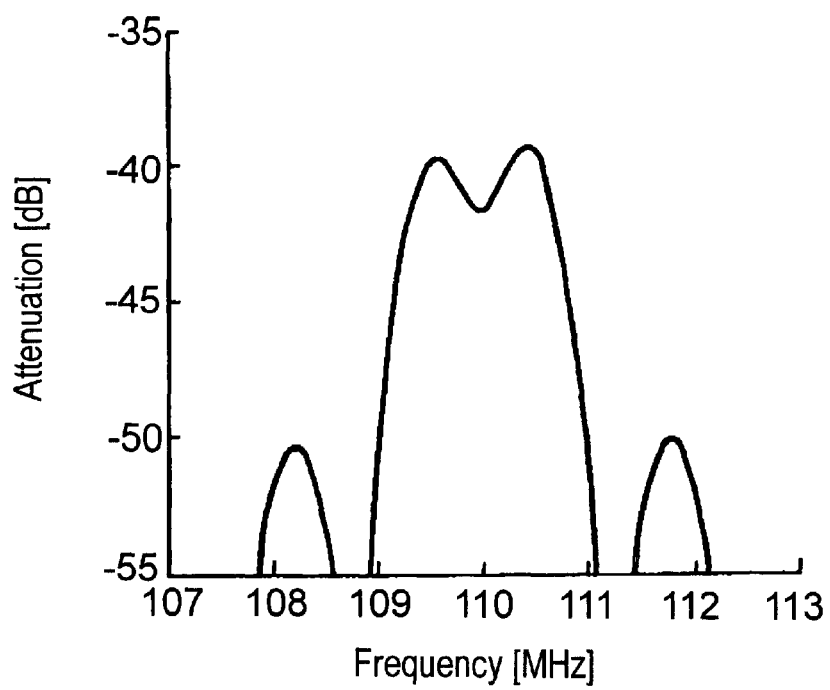
FIG. 21A Characteristic showing the electro-mechanical conversion in the direction of stronger propagation in a comparative example of the SAW filter.
Figure 21B:
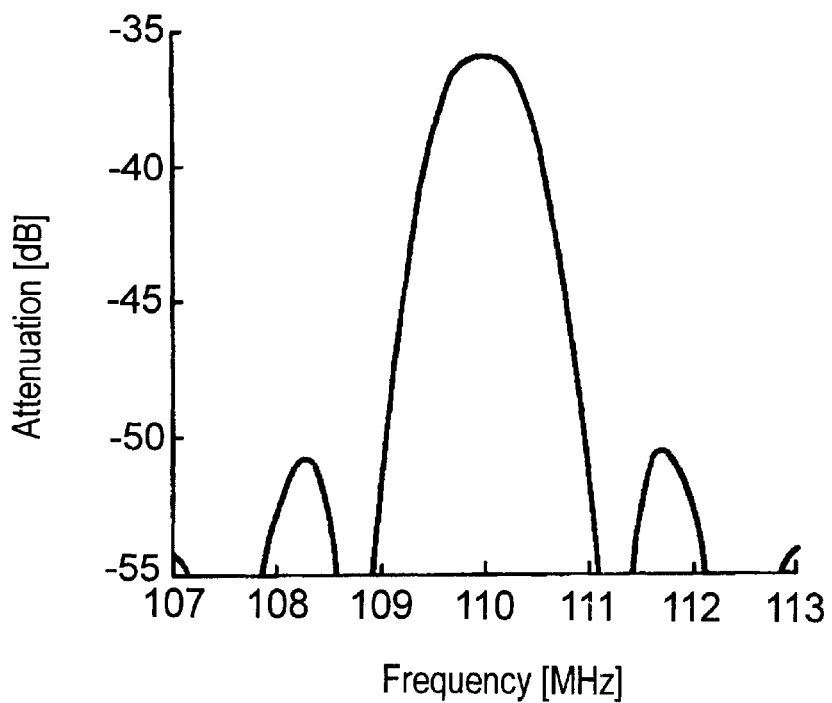
FIG. 21B Characteristic showing the electro-mechanical conversion in the direction of weaker propagation in the comparative example of the SAW filter.

For the sake of comparison, other filter track having the same structure except that $\alpha=\beta=0.41$, $\gamma=2$ was prepared. The electro-mechanical conversion characteristic with respect to the stronger directional property of thus prepared filter track is shown in FIG. 21A, and that with the weaker directional property in FIG. 21B.

When FIG. 20 are compared with FIG. 21, it becomes known that in a case where the electrode finger couple having different line widths and that having the same line width are mixed together, the symmetry is further improved when the conditions that $\gamma>\alpha+\beta$ and $\alpha<\beta$ are met. Thus the ripple in a pass band can be made smaller, and the attenuation outside the pass band greater.

Figure 22:
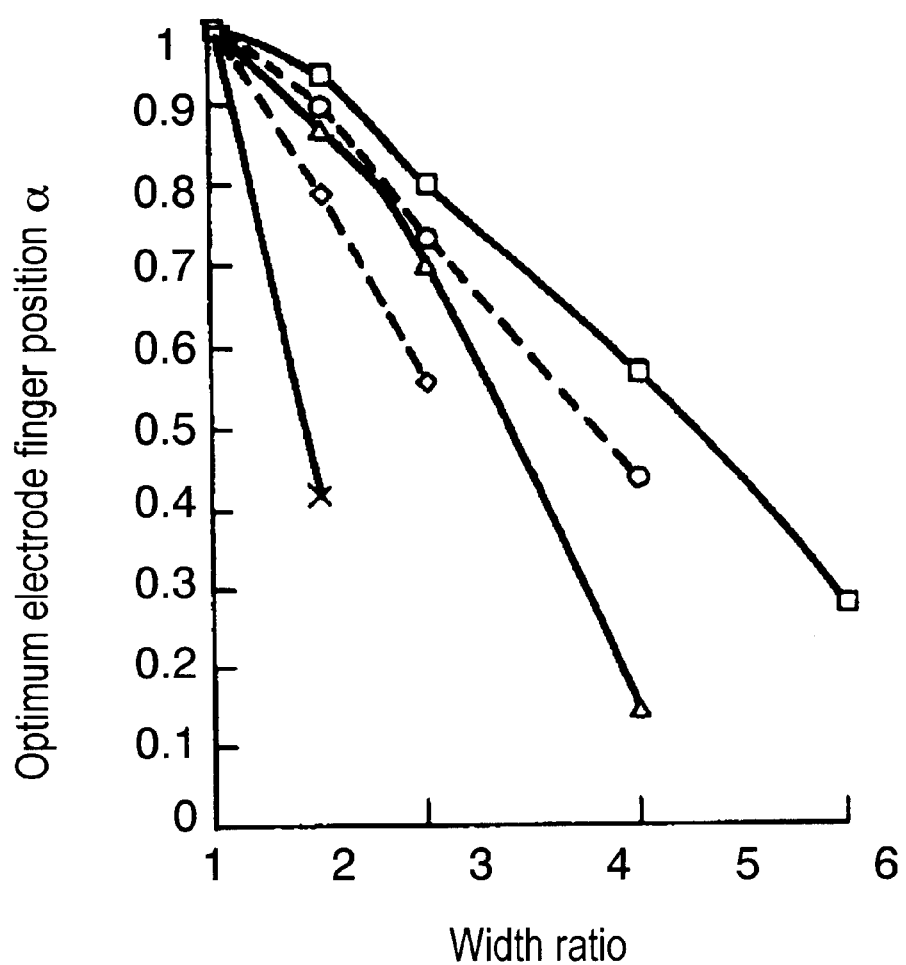
FIG. 22 Relationship between the ratio of line width and the α in embodiment 6.
Figure 23:
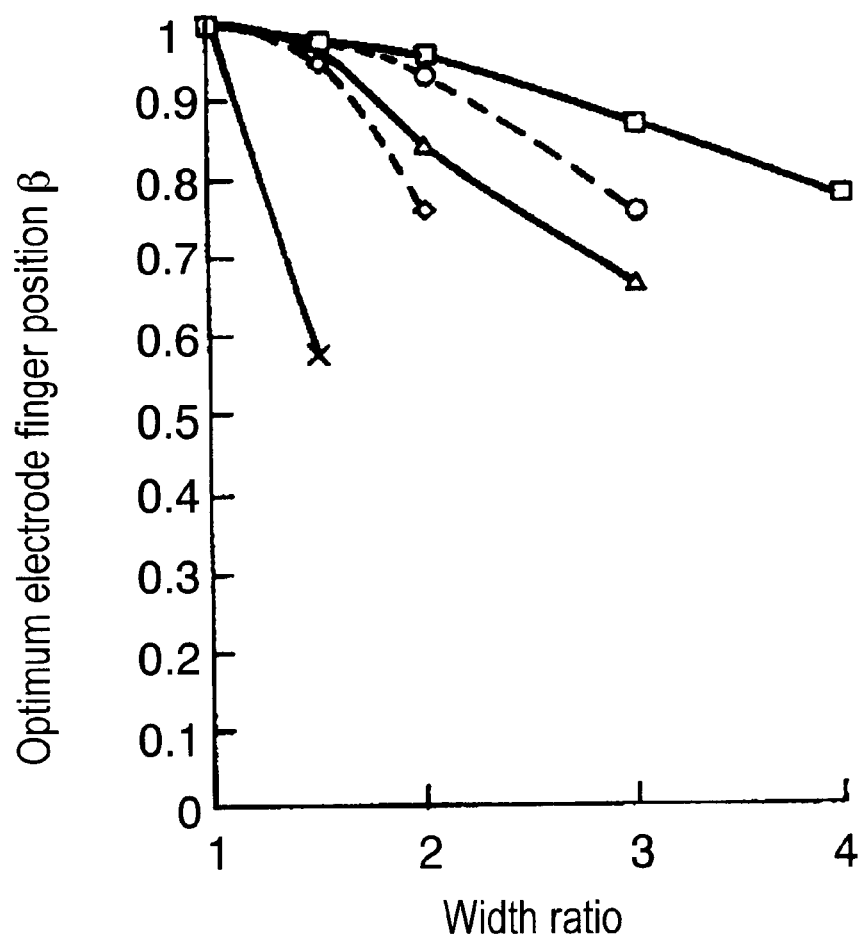
FIG. 23 Relationship between the ratio of line width and the β in embodiment 6.

FIG. 22 and FIG. 23 show optimum values of the $\alpha$ and the $\beta$ at $\gamma=2$, in the examples of SAW filter for the film thickness ratios 0.005, 0.010, 0.015, 0.020, 0.030, where a 28°–42° revolving Y cut crystal is used for the piezoelectric substrate 141, filter tracks of center frequency 110 MHz each having input/output IDT electrodes consisting of 50 pairs of electrode finger couple formed of electrode fingers of different line widths and 40 pairs of electrode finger couple formed of electrode fingers of the same line width formed on the same piezoelectric substrate. It is known that when the line width ratio is greater than 1, there exists a relationship that $$\gamma>\alpha+\beta \text{ and } \alpha<\beta.$$

Seventh Embodiment

Figure 24:
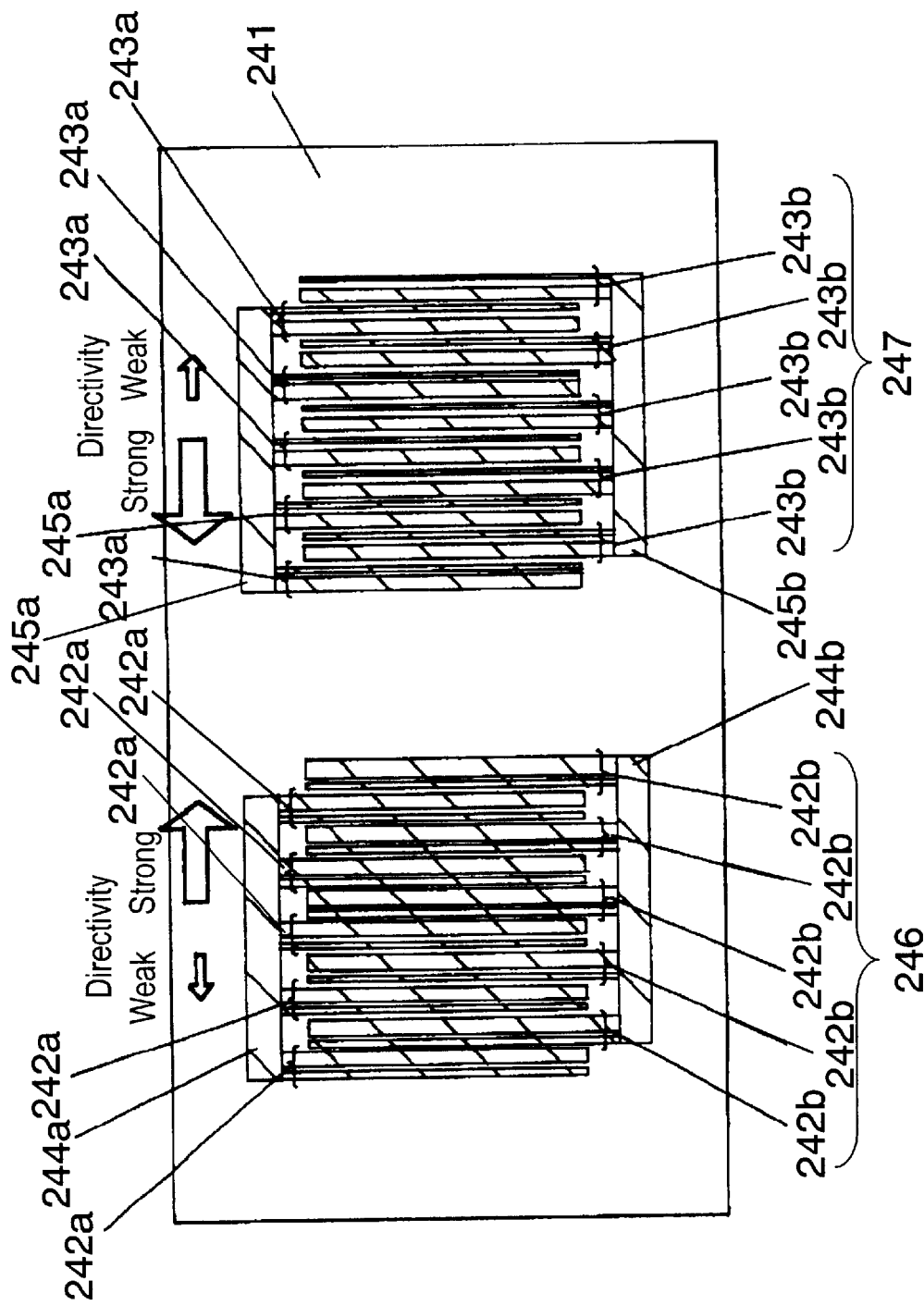
FIG. 24 Plan view of a filter track in a seventh exemplary embodiment.
Figure 25:
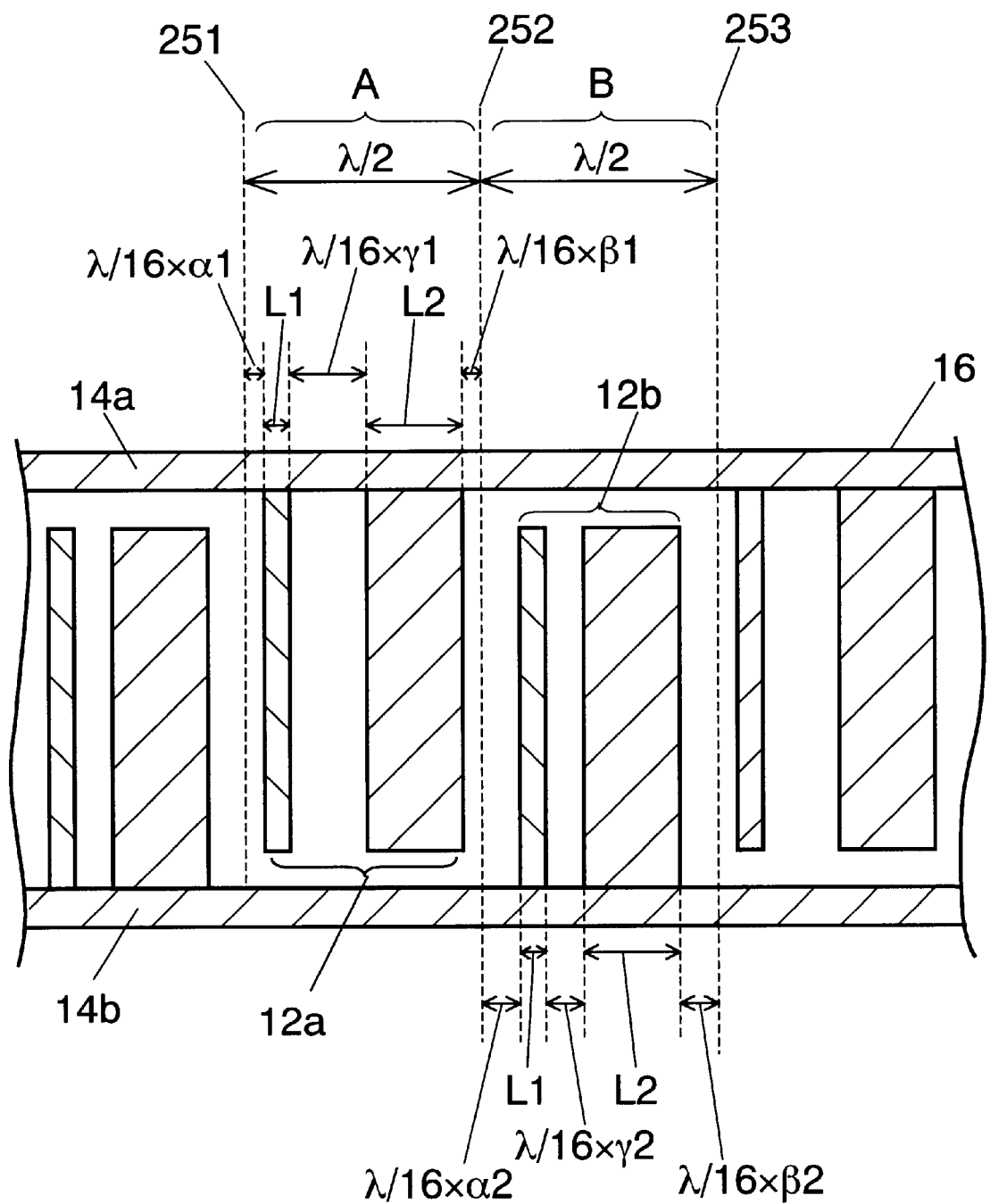
FIG. 25 Magnified view of a key portion of FIG. 24.

FIG. 24 shows plan view of filter track in a seventh exemplary embodiment. FIG. 25 is magnified view in a key portion of FIG. 24.

As shown in FIG. 24, an input IDT electrode 246 and an output IDT electrode 247 are formed, using a material containing aluminum as the main component, on a piezoelectric substrate 241 disposed in line with the direction of surface acoustic wave transfer at a certain predetermined space in between. The respective IDT electrode 246 and 247 comprise electrode finger couples 242a, 242b and 243a, 243b, and lead electrodes 244a, 244b and 245a, 245b. Each of the electrode finger couples 242a, 242b and 243a, 243b consists of two electrode fingers of different line width.

The IDT electrode 246 and the IDT electrode 247 are disposed opposing in the directional property.

As shown in FIG. 25, the respective areas A and B defined by splitting an IDT electrode 246 by a unit of 1/2 λ contain the electrode finger couples 242a and 242b. Defining the line width of the finer electrode finger of electrode finger couples 242a, 242b as L1, that of the broader electrode finger as L2; then, the line width ratio (L2/L1) is determined to be not smaller than 1, preferably 1.4–3.6. In the IDT electrode 246, the area A and the area B are existing alternately. Border lines 251, 252, 253 define the areas A and B. A value of distance between the finer electrode finger of electrode finger couples 242a, 242b and the border lines 251, 252 normalized with λ/16 is defined as α1, α2, respectively; a value of distance between the finer electrode finger and the broader electrode finger normalized with λ/16 is defined as γ1, γ2, respectively; a value of distance between the broader electrode finger and the border lines 252, 253 normalized with λ/16 is defined as β1, β2, respectively. Furthermore, the film thickness ratio (h/λ; where, h represents film thickness of input IDT electrode 246, λ represents wavelength of surface acoustic wave) is determined to be 0.015, the line width ratio 2, α1=β1=0, β1=4, α2=β2=1.5, γ2=1; namely, γ1>α1+β1, γ2≦α2+β2.

The IDT electrode 247 has the same structure as the IDT electrode 246.

Figure 26:
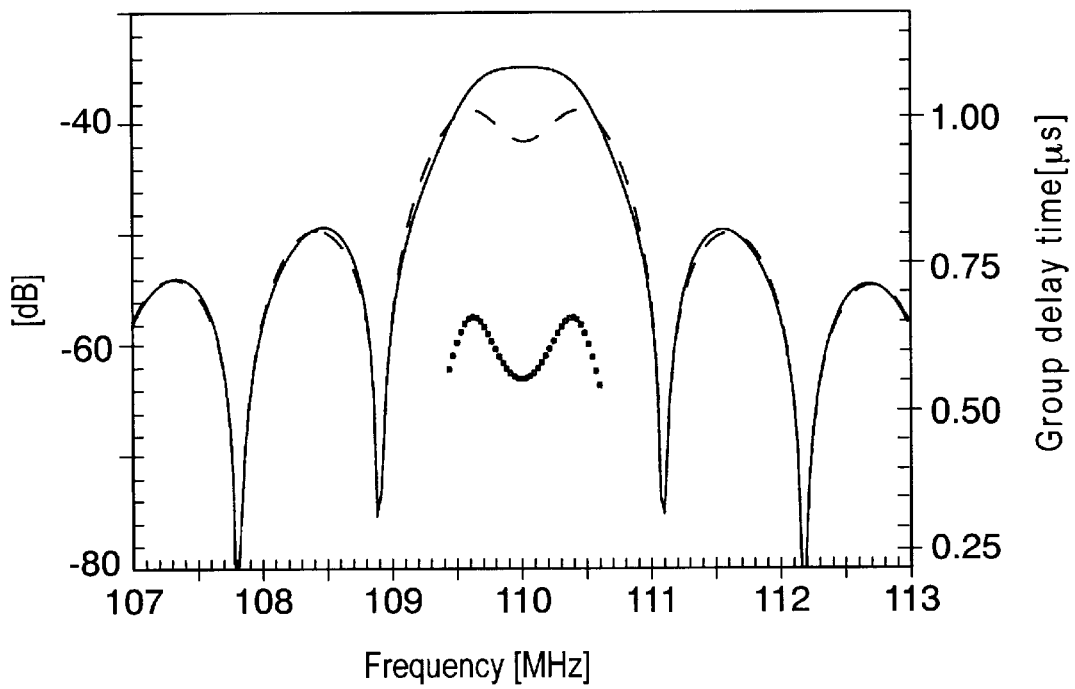
FIG. 26 Characteristic of the filter track of FIG. 24.
Figure 27:
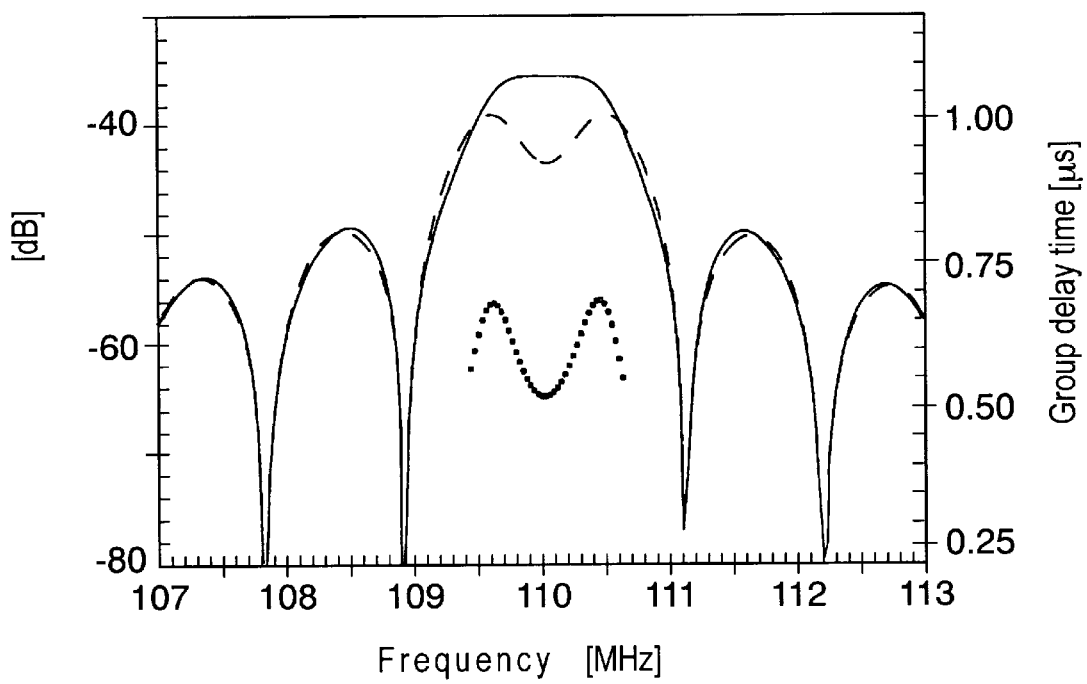
FIG. 27 Characteristic of filter track in a comparative example.

Electro-mechanical conversion characteristic of the above filter track is shown in FIG. 26. For the sake of comparison, the electro-mechanical conversion characteristic of other filter track is shown in FIG. 27, which filter track having the same structure except that α1=β1=α2 =β2=0.75, γ1=γ2=2.5, namely γ1>α1+β1, γ2>α2+β2 (a filter track corresponding to that in embodiment 5).

As compared with embodiment 5 (FIG. 27), difference in the electro-mechanical conversion characteristic between the stronger directional property and the weaker directional property (hereinafter referred to as "directional property") is averaged through the pass band in the present embodiment (FIG. 26). So the variation in the group delay time is small within the pass band. Namely, the ripple can be made smaller.

Thus in a case where the input/output IDT electrodes are formed of electrode finger couples 242a, 242b, 243a, 243b consisting of electrode fingers of different line width, the flatness within a pass band can be improved further by making the formulae γ1>α1+β1, γ2≦α2+β2 satisfied.

Although it is not essential to have the area A and the area B alternated in one IDT electrode, the unidirectional property of surface acoustic wave can be controlled well by disposing the regions alternately. This contributes to suppress the ripple in a pass band due to an insufficient directional property or an excessive directional property provided thereto. Thus the flatness in a pass band is further improved.

Furthermore, by providing an IDT electrode with the area A and the area B for approximately the same numbers, the unidirectional property of the surface acoustic wave may be controlled well, and the ripple due to an insufficient directional property or an excessive directional property in a pass band may be suppressed, and the flatness in a pass band is further improved.

The IDT electrodes 246 and 247 have been structured the same in the present embodiment, so the same line width ratio is shared. In a case where the IDT electrode 246 and the IDT electrode 247 are structured different, the unidirectional property of the surface acoustic wave may be controlled well by optimizing the respective line width ratio. Thus the ripple due to an insufficient directional property or an excessive directional property in a pass band may be suppressed, and the flatness in a pass band can be further improved. In any case, the line width ratio of the IDT electrodes 246, 247 should be not less than 1, preferably 1.4–3.6, for reducing the insertion loss.

Eighth Embodiment

Figure 28:
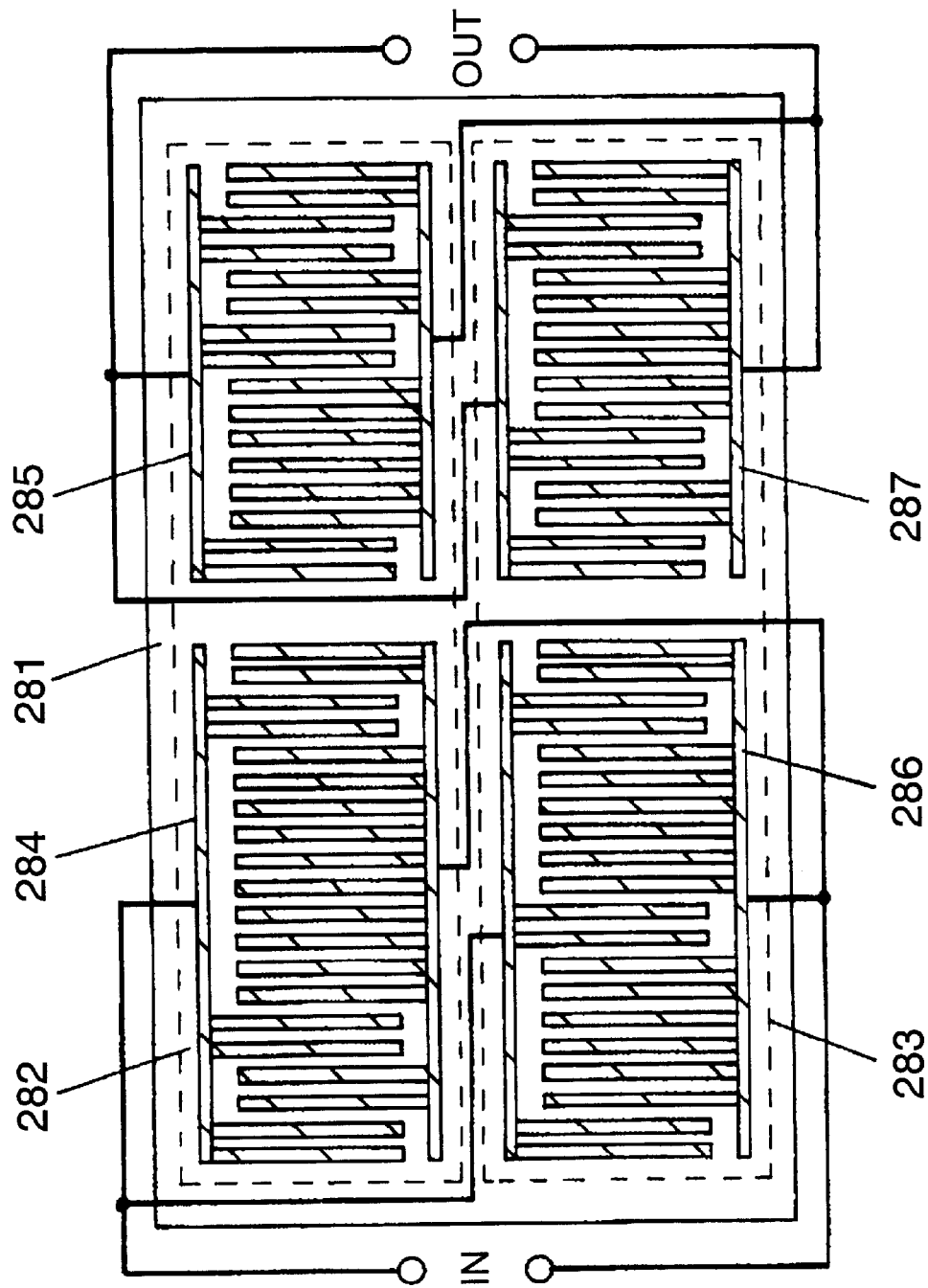
FIG. 28 Plan view of a SAW filter in an eight exemplary embodiment.

FIG. 28 shows plan view of a SAW filter in accordance with an eighth exemplary embodiment. A first filter track 282 and a second filter track 283 are provided parallel on a piezoelectric substrate 281 made of a 28°–42° revolving Y cut crystal, as shown in FIG. 28. The first filter track 282 is provided with an input IDT electrode 284 and an output IDT electrode 285. Likewise, the second filter track 283 is provided with an input IDT electrode 286 and an output IDT electrode 287.

The IDT electrode 284 of the first filter track 282 is connected in parallel with the IDT electrode 286 of second filter track 283, and the IDT electrode 285 of first filter track 282 is connected in parallel with the IDT electrode 287 of second filter track 283.

Operation of the above-configured SAW filter is described below.

Figure 29A:
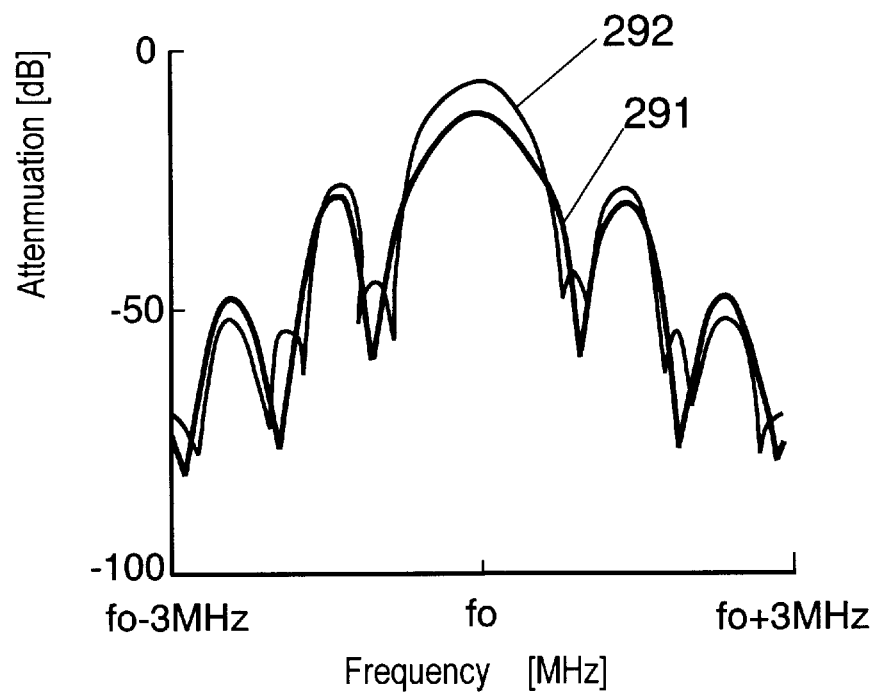
FIG. 29A Amplitude characteristic of each SAW filter track in FIG. 28.
Figure 29B:
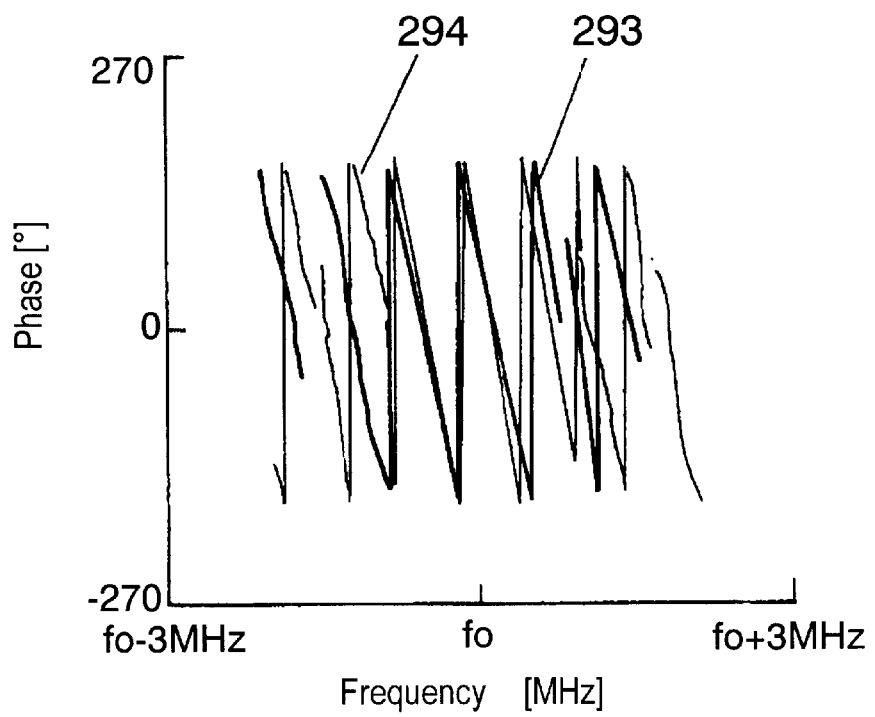
FIG. 29B Phase characteristic of each SAW filter track in FIG. 28.
Figure 30:
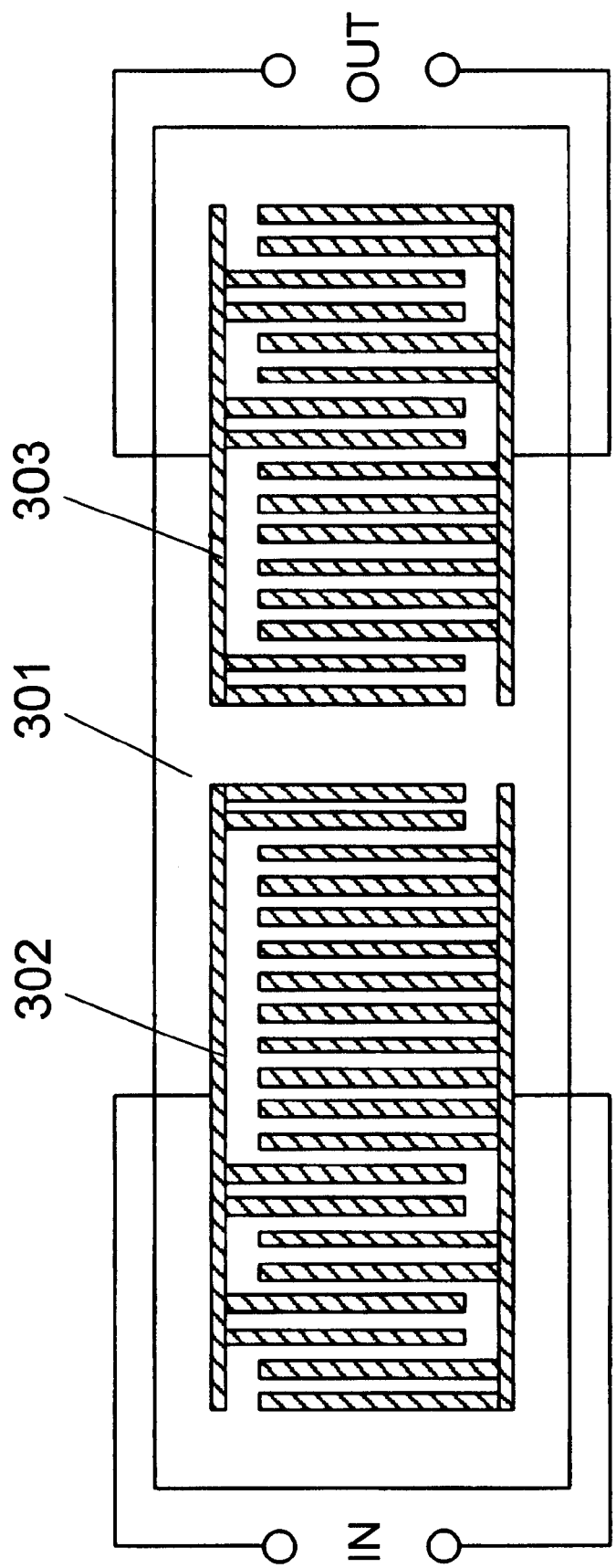
FIG. 30 Plan view of a conventional SAW filter.

FIG. 29A shows amplitude characteristic 291 of the first filter track 282 and amplitude characteristic 292 of the second filter track 283 of FIG. 28. FIG. 29B shows phase characteristic 293 of the first filter track 282 and phase characteristic curve 294 of the second filter track 283 of FIG. 28.

As seen in FIG. 29B, difference in the phase between the first filter track 282 and the second filter track 283 is approximately 0°, or substantially same-phased, in a pass band. Substantially same-phased means that the phase difference is within a range −50°–+50°, preferably −20°–+20°.

Outside the pass band, the difference in phase is approximately 180° between the first filter track 282 and the second filter track 283, or it is substantially inverse-phased. Substantially inverse-phased means that the phase difference is within a range 130°–230°, preferably 160°–200°.

As shown in FIG. 29A, the amplitude characteristic 291 of first filter track 282 has a broad pass band, although there are much attenuation. On the other hand, the amplitude characteristic 292 of second filter track 283 has a narrow pass band, although there are small attenuation. The first filter track 282 and the second filter track 283 are substantially same-phased in a pass band; so, electrically connecting the filter tracks in parallel results in a flat and broad pass band.

With respect to the amplitude characteristic 291 of first filter track 282 and the amplitude characteristic 292 of second filter track 283, the spurious level outside a pass band is not quite suppressed. And there is no difference in the peak frequency of the spurious, or they are almost identical. However, since the first filter track 282 and the second filter track 283 are substantially inverse-phased to each other outside the pass band, the spurious of first filter track 282 and that of second filter track 283 offset to each other. Thus a great attenuation is obtained outside the pass band.

In this way, a SAW filter having a flat and broad pass band and superior in the attenuation outside the pass band is implemented by bringing relative relationship in the phase between the first filter track 282 and second filter track 283 having respective amplitude characteristics 291 and 292 as shown in FIG. 29A into substantially the same phase within a pass band, and substantially inverse-phased outside the pass band.

Also in the present embodiment, the electrode structures as described in embodiments 2 through 7 may be used for the IDT electrodes 284, 285, 286, 287 for the same effects. The first filter track 282 needs to have an amplitude characteristic that the attenuation is great, but the pass band is broad; while the second filter track 283 needs to have an amplitude characteristic that the attenuation is small, but the pass band is narrow. Furthermore, the first and the second filter tracks 282, 283 need to have flat characteristic within the pass band.

Now in the following, points of the present invention will be summarized.

(1) In order to offer a SAW filter that has a flat and broad pass band and superior in the attenuation outside the pass band, interrelationship in the amplitude characteristic between the first and the second filter tracks should preferably assume a shape as shown in FIG. 2A, or FIG. 29A.

(2) The first filter track and the second filter track need to be substantially inverse-phased to each other in a frequency next to the pass band where the attenuation characteristic is required. However, in a frequency region away from the pass band, it does not necessarily need to be inverse. A sufficient attenuation characteristic may be obtained there through the amplitude characteristic of first and second filter tracks.

(3) Length of the input/output IDT electrodes in the present SAW filters is shorter as compared to that in conventional filters, so a significant downsizing is possible with SAW filters. The SAW filters of the present invention can make a significant contribution to the downsizing efforts being exerted in the portable telephones and other telecommunication gear industry.

(4) The present SAW filters exhibit the same performance, even if a sound absorbing material or other staff is employed by some needs.

Figure 10:
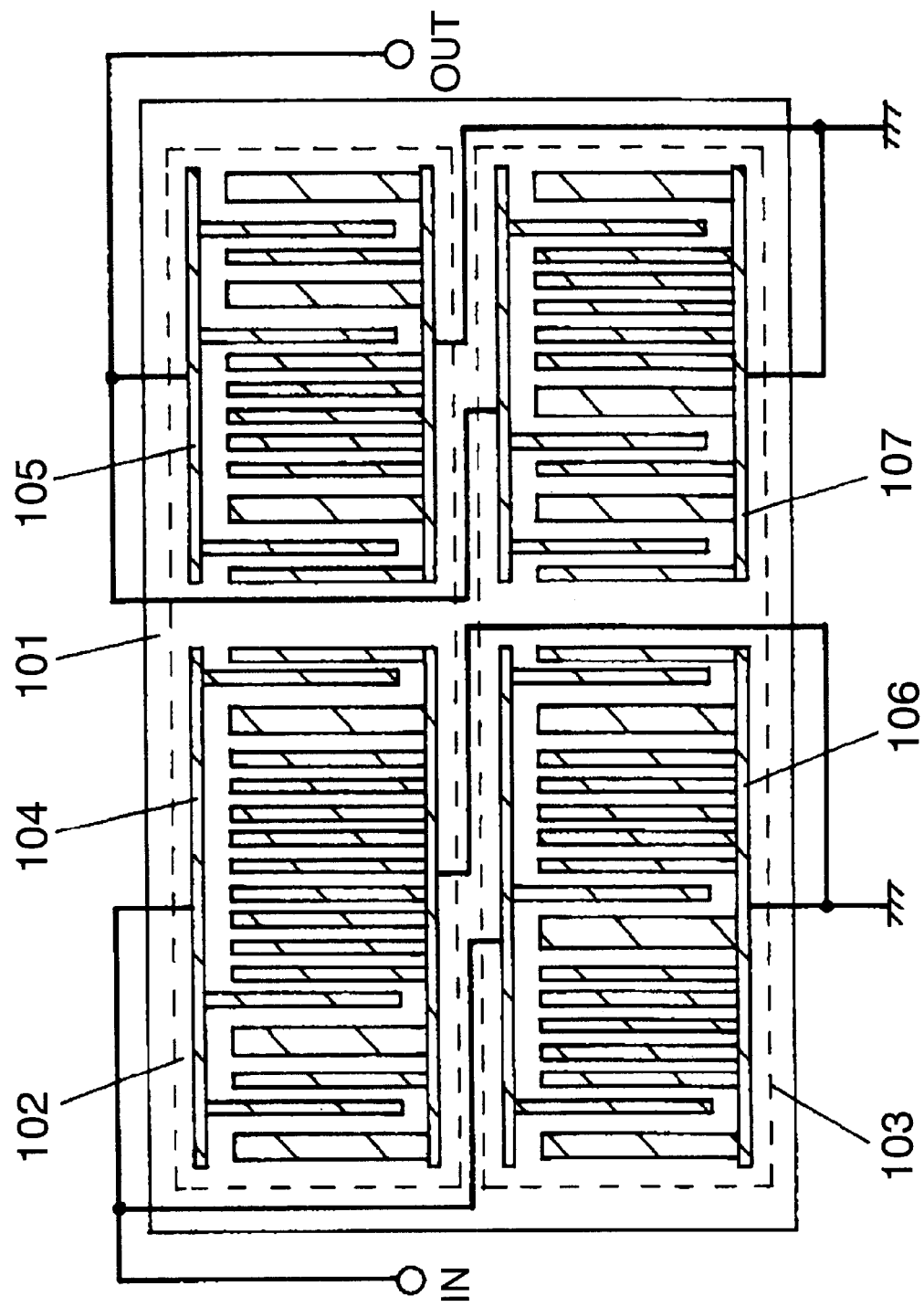
FIG. 10 Plan view of a SAW filter in other exemplary embodiment of the present invention.
Figure 11:
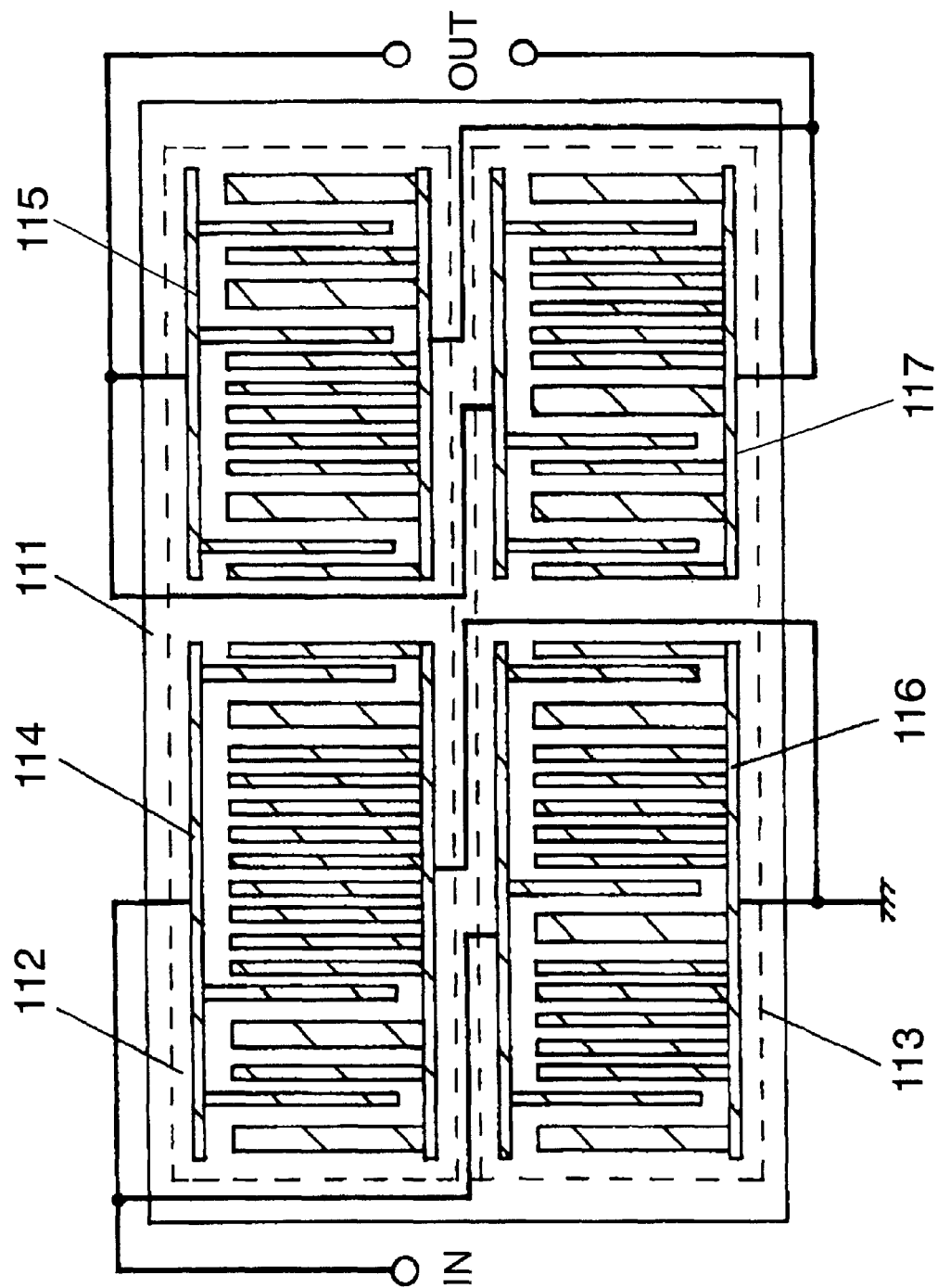
FIG. 11 Plan view of a SAW filter in other exemplary embodiment of the present invention.

(5) Although balanced type input/output terminals have been used in the present embodiment, use of the imbalance type terminals as shown in FIG. 10, or mixed use of the balanced type and the imbalance type as shown in FIG. 11 does not affect the performance.

In a case where unidirectional IDT electrodes, such as input/output IDT electrodes 104, 105, 106, 107 shown in FIG. 10, and input/output IDT electrodes 114, 115, 116, 117 shown in FIG. 11, or input/output IDT electrodes weighted by thinning are used, it is preferred to ground a terminal in the electrode finger side which a reflector electrode or a dummy electrode for acoustic velocity control is provided. This is because of the effects for suppressing the floating capacitance, minimizing the loss and obtaining the high attenuation.

Figure 12:
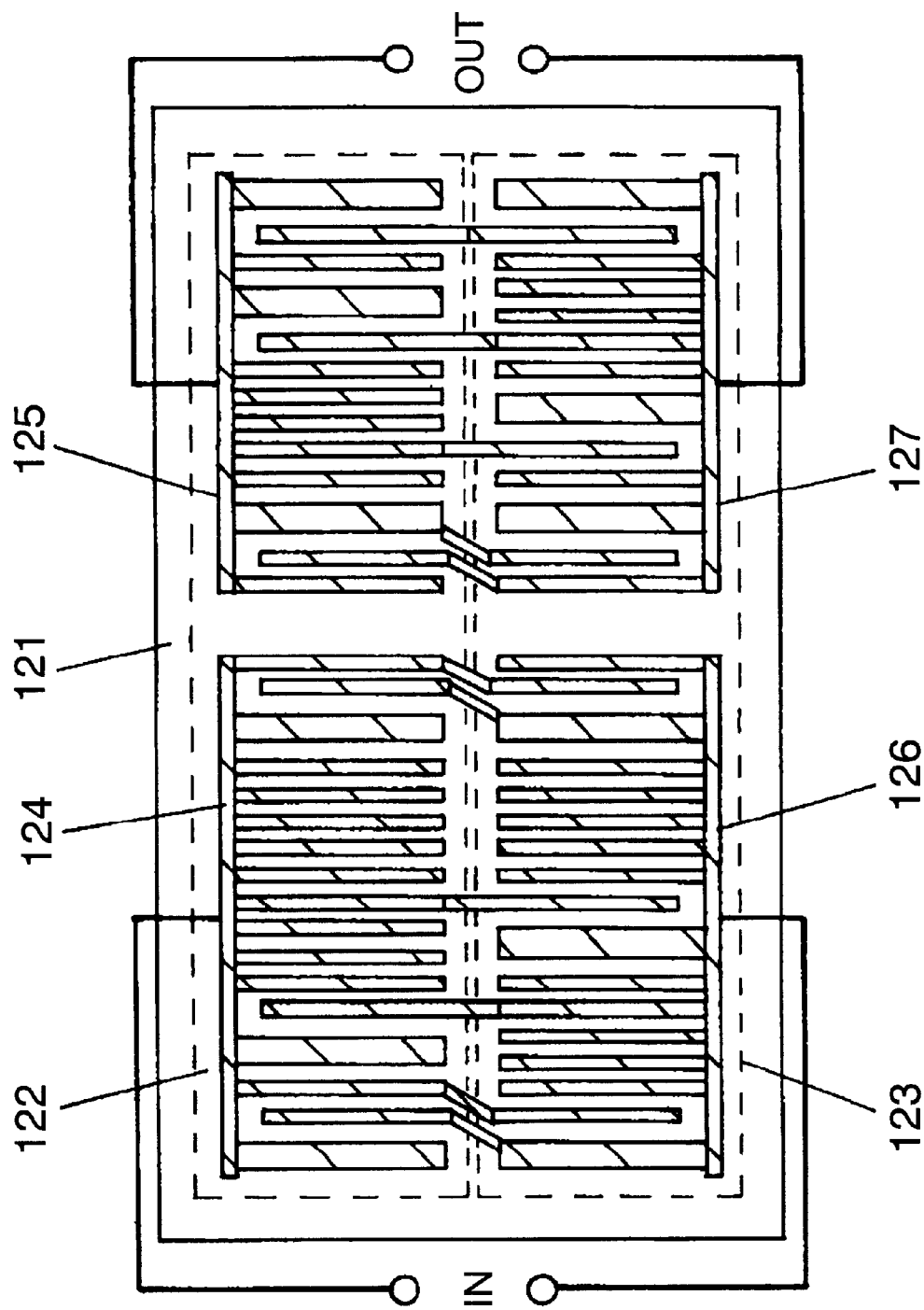
FIG. 12 Plan view of a SAW filter in other exemplary embodiment of the present invention.

(6) In each of the above-described embodiments, the first filter track 12 and the second filter track 13 have been connected in parallel using lead electrodes, as shown in FIG. 1. However, the same effect is obtainable be connecting, as shown in FIG. 12, the input IDT electrode 124 of first filter track 122 direct with the input IDT electrode 126 of the second filter track 123, and the output IDT electrode 125 of the first filter track 122 direct with the output IDT electrode 127 of second filter track 123 on the piezoelectric substrate 121. In the above-described configuration, length in the direction of crossing width can be reduced for a further downsizing of a SAW filter. Also, the loss due to resistance of lead electrode can be reduced to a smaller insertion loss.

(7) When crystal is used for the piezoelectric substrate, the frequency drift is exhibited by a curve of the second order. Taking the practical film thickness and the metallization ratio into consideration, what is preferred is a 28°–42° revolving Y cut crystal. Then, the peak temperature can be made to substantially coincide with the center of operating temperature, and the frequency drift within the operating temperature can be made smaller.

INDUSTRIAL APPLICABILITY

The present invention offers a SAW filter that has a broad and flat pass band and superior in the attenuation available at the vicinity of the pass band. Despite the improved performance it offers, the SAW filter is implemented in smaller dimensions as compared with conventional filters. Thus the SAW filters of the present invention are suitable for use as filters in small-size telecommunication equipment.

We claim:

1. A surface acoustic wave filter comprising at least two filter tracks each having an inter digital transducer (IDT) electrode for input and an IDT electrode for output, wherein
   input IDT electrodes of said at least two filter tracks are connected in parallel,
   output IDT electrodes of said at least two filter tracks are connected in parallel,
   said at least two filter tracks are substantially same-phased within a pass band, while they are substantially inverse-phased outside the pass band, and
   frequency values of said at least two filter tracks substantially coincide at a point lower by 3 dB from the peak value of transfer function.

2. The surface acoustic wave filter of claim 1, wherein at least either one among said input IDT electrode and said output IDT electrode is unidirectional.

3. The surface acoustic wave filter of claim 2, wherein said unidirectional electrode contains a portion where the direction of propagation is contradictory to the rest.

4. The surface acoustic wave filter of claim 2, wherein metallization ratio of said IDT electrode falls within a range 0.45–0.65, where; the metallization ratio is defined as, "total sum of electrode finger widths within a half wavelength/half wavelength of propagating SAW".

5. The surface acoustic wave filter of claim 2, wherein at least one among said input IDT electrode and said output IDT electrode is provided with four electrode fingers within a wavelength, at least some of said electrode fingers are forming an electrode finger couple consisting of electrode fingers of different line width, and ratio in the width of finer electrode finger versus broader electrode finger of said electrode finger couple (line width ratio) is not smaller than 1.

6. The surface acoustic wave filter of claim 5, wherein said line width ratio is different between said input IDT electrode and said output IDT electrode.

7. The surface acoustic wave filter of claim 5, wherein distance between the electrode fingers of said electrode finger couple satisfies following formula:

$$\gamma > \alpha + \beta$$

where;

γ: distance between finer electrode finger and broader electrode finger of electrode finger couple, normalized with λ/16

α: distance between one end of an area of IDT electrode as divided by a unit of λ/2 and finer electrode finger of electrode finger couple, normalized with λ/16

β: distance between the other end of an area of IDT electrode as divided by a unit of λ/2 and broader electrode finger of electrode finger couple, normalized with λ/16.

8. The surface acoustic wave filter of claim 5 provided with at least two pairs of electrode finger couple consisting of electrode fingers of different line width, wherein at least one pair of said electrode finger couple satisfies formula (1), while other electrode finger couple satisfies formula (2) below:

$$\gamma > \alpha + \beta \quad (1)$$

$$\gamma \leq \alpha + \beta \quad (2)$$

where;

γ: distance between finer electrode finger and broader electrode finger of electrode finger couple, normalized with λ/16

α: distance between one end of an area of IDT electrode as divided by a unit of λ/2 and finer electrode finger of electrode finger couple, normalized with λ/16

β: distance between the other end of an area of IDT electrode as divided by a unit of λ/2 and broader electrode finger of electrode finger couple, normalized with λ/16.

9. The surface acoustic wave filter of claim 8, wherein number of the electrode finger couples satisfying said formulae (1) and (2) is the same.

10. The surface acoustic wave filter of claim 8, wherein one of said electrode finger couple satisfies said formula (1), while an electrode finger couple locating next to it satisfies said formula (2).

11. The surface acoustic wave filter of claim 2, wherein said electrode finger is formed of a metal containing aluminum as the main component, and ratio of film thickness of the electrode finger versus wavelength λ of surface acoustic wave falls within a range 0.005–0.035.

12. The surface acoustic wave filter of claim 2, wherein a 28°–42° revolving Y cut crystal is used for said piezoelectric substrate.

13. A surface acoustic wave filter comprising two filter tracks each having an inter digital transducer (IDT) electrode for input and an IDT electrode for output, wherein input IDT electrodes of said two filter tracks are connected in parallel, output IDT electrodes of said two filter tracks are connected in parallel, said two filter tracks are substantially same-phased within a pass band while they are substantially inverse-phased outside the pass band, said two filter tracks substantially coincide in the center frequency, and pass band width of one filter track is greater than that of the other filter track.

14. The surface acoustic wave filter of claim 13, wherein at least either one among said input IDT electrode and said output IDT electrode is unidirectional.

15. The surface acoustic wave filter of claim 14, wherein said unidirectional electrode contains a portion where the direction of propagation is contradictory to the rest.

16. The surface acoustic wave filter of claim 14, wherein metallization ratio of said IDT electrode falls within a range of 0.45–0.65, where; the metallization ratio is defined as, "total sum of electrode finger widths within a half wavelength/half wavelength of propagating SAW".

17. The surface acoustic wave filter of claim 14, wherein at least one among said input IDT electrode and said output IDT electrode is provided with four electrode fingers within a wavelength, at least some of said electrode fingers are forming an electrode finger couple consisting of electrode fingers of different line width, and ratio in the width of finer electrode finger versus broader electrode finger of said electrode finger couple (line width ratio) is not smaller than 1.

18. The surface acoustic wave filter of claim 17, wherein said line width ratio is different between said input IDT electrode and said output IDT electrode.

19. The surface acoustic wave filter of claim 17, wherein distance between the electrode fingers of said electrode finger couple satisfies following formula:

$$\gamma > \alpha + \beta$$

where;

γ: distance between finer electrode finger and broader electrode finger of electrode finger couple, normalized with λ/16

α: distance between one end of an area of IDT electrode as divided by a unit of λ/2 and finer electrode finger of electrode finger couple, normalized with λ/16

β: distance between the other end of an area of IDT electrode as divided by a unit of λ/2 and broader electrode finger of electrode finger couple, normalized with λ/16.

20. The surface acoustic wave filter of claim 17 provided with at least two pairs of electrode finger couple consisting of electrode fingers of different line width, wherein at least one pair of said electrode finger couple satisfies formula (1), while other electrode finger couple satisfies formula (2) below:

$$\gamma > \alpha + \beta \quad (1)$$
$$\gamma \leq \alpha + \beta \quad (2)$$

where;
- $\gamma$: distance between finer electrode finger and broader electrode finger of electrode finger couple, normalized with $\lambda/16$
- $\alpha$: distance between one end of an area of IDT electrode as divided by a unit of $\lambda/2$ and finer electrode finger of electrode finger couple, normalized with $\lambda/16$
- $\beta$: distance between the other end of an area of IDT electrode as divided by a unit of $\lambda/2$ and broader electrode finger of electrode finger couple, normalized with $\lambda/16$.

21. The surface acoustic wave filter of claim 20, wherein number of the electrode finger couples meeting said formulae (1) and (2) is the same.

22. The surface acoustic wave filter of claim 20, wherein one of said electrode finger couple satisfies said formula (1), while an electrode finger couple locating next to it satisfies said formula (2).

23. The surface acoustic wave filter of claim 14, wherein said electrode finger is formed of a metal containing aluminum as the main component, and ratio of film thickness of the electrode finger versus wavelength $\lambda$ of surface acoustic wave falls within a range 0.005–0.035.

24. The surface acoustic wave filter of claim 14, wherein a 28°–42° revolving Y cut crystal is used for said piezoelectric substrate.

* * * * *

UNITED STATES PATENT AND TRADEMARK OFFICE
CERTIFICATE OF CORRECTION

PATENT NO.    : 6,476,691 B1                                                  Page 1 of 1
DATED         : November 5, 2002
INVENTOR(S)   : Shigeru Tsuzuki et al.

It is certified that error appears in the above-identified patent and that said Letters Patent is hereby corrected as shown below:

<u>Title page,</u>
Item [56], References Cited, U.S. PATENT DOCUMENTS, insert
-- 6,011,344     1/2000      Dufilie et al. --.
Following listing of U.S. PATENT DOCUMENTS, insert

-- FOREIGN PATENT DOCUMENTS

GR     1 512 790     6/1978
        JP     2000-77974    3/2000
        EP     0 982 859     3/2000
        JP     62-261211     11/1987 --.

Signed and Sealed this

Twenty-sixth Day of August, 2003

JAMES E. ROGAN
*Director of the United States Patent and Trademark Office*